(12) United States Patent
Ishino et al.

(10) Patent No.: US 9,070,905 B2
(45) Date of Patent: Jun. 30, 2015

(54) ORGANIC ELECTRONIC DEVICE MANUFACTURING METHOD AND ORGANIC EL DEVICE MANUFACTURING METHOD

(71) Applicant: JOLED INC., Tokyo (JP)

(72) Inventors: Shinichiro Ishino, Osaka (JP); Tomoki Masuda, Osaka (JP); Haruka Kusukame, Nara (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/389,083

(22) PCT Filed: Aug. 22, 2013

(86) PCT No.: PCT/JP2013/004969
§ 371 (c)(1),
(2) Date: Sep. 29, 2014

(87) PCT Pub. No.: WO2014/030354
PCT Pub. Date: Feb. 27, 2014

(65) Prior Publication Data
US 2015/0044805 A1    Feb. 12, 2015

(30) Foreign Application Priority Data
Aug. 23, 2012   (JP) ................................ 2012-184102

(51) Int. Cl.
*H01L 51/56*   (2006.01)
*H01L 27/32*   (2006.01)
*H01L 51/00*   (2006.01)

(52) U.S. Cl.
CPC ............ *H01L 51/56* (2013.01); *H01L 27/3209* (2013.01); *H01L 27/3246* (2013.01); *H01L 51/0005* (2013.01); *H01L 51/0004* (2013.01)

(58) Field of Classification Search
CPC . H01L 51/0004; H01L 51/0005; H01L 51/56; H01L 27/3209; H01L 27/3246
USPC ...................................... 438/34, 99
See application file for complete search history.

(56) References Cited

U.S. PATENT DOCUMENTS 6,810,919 B2 * 11/2004 Seki et al. ........................ 141/1
6,825,061 B2 * 11/2004 Hokari et al. ................... 438/99

(Continued)

FOREIGN PATENT DOCUMENTS

| JP | 2007-280866 | 10/2007 |
| JP | 2008-243545 | 10/2008 |

(Continued)

OTHER PUBLICATIONS

International Search Report (ISR) in International Patent Application No. PCT/JP2013/004969, dated Nov. 26, 2013.

*Primary Examiner* — Mary Wilczewski
(74) *Attorney, Agent, or Firm* — Greenblum & Bernstein, P.L.C.

(57) ABSTRACT

A manufacturing method including: forming a first electrode; forming a first bank; forming a first organic functional film; forming a second bank; forming a second organic functional film; and forming a second electrode. In the forming of the second bank, the second bank is formed such that, in plan view, a bottom edge of a sidewall surface of the second bank facing the second aperture is located at the same position as or is set back from a bottom edge of a sidewall surface of the first bank facing the first aperture. In the forming of the second organic functional film, the droplet of the second ink is applied such that an upper edge of the second organic functional film within the second aperture is located at a same level as or at a higher level than the bottom edge of the sidewall surface of the second bank.

8 Claims, 11 Drawing Sheets

(56) References Cited

U.S. PATENT DOCUMENTS

| | | | |
|---|---|---|---|
| 6,852,994 B2 * | 2/2005 | Seki et al. | 257/40 |
| 6,887,631 B2 * | 5/2005 | Kiguchi et al. | 430/7 |
| 6,911,773 B2 * | 6/2005 | Seki | 313/506 |
| 6,948,533 B2 * | 9/2005 | Seki et al. | 141/1 |
| 7,012,367 B2 * | 3/2006 | Seki | 313/506 |
| 7,071,486 B2 * | 7/2006 | Sakai | 257/40 |
| 7,164,455 B2 * | 1/2007 | Takagi et al. | 349/114 |
| 7,195,334 B2 * | 3/2007 | Nakamura | 347/29 |
| 7,273,637 B2 * | 9/2007 | Morii | 427/256 |
| 7,282,843 B2 * | 10/2007 | Kiguchi et al. | 313/112 |
| 7,449,351 B2 * | 11/2008 | Yamada | 438/29 |
| 7,656,084 B2 * | 2/2010 | Ishida | 313/504 |
| 7,791,269 B2 * | 9/2010 | Seki | 313/504 |
| 7,842,947 B2 * | 11/2010 | Nakatani et al. | 257/40 |
| 7,923,919 B2 * | 4/2011 | Okano | 313/504 |
| 8,029,850 B2 * | 10/2011 | Ishii | 427/66 |
| 8,049,404 B2 * | 11/2011 | Chuman et al. | 313/503 |
| 8,154,032 B2 * | 4/2012 | Yanagihara | 257/88 |
| 8,536,589 B2 | 9/2013 | Matsushima | |
| 8,546,820 B2 | 10/2013 | Matsushima | |
| 8,546,821 B2 | 10/2013 | Matsushima | |
| 8,581,273 B2 * | 11/2013 | Takei | 257/89 |
| 8,604,492 B2 | 12/2013 | Matsushima | |
| 8,604,493 B2 | 12/2013 | Matsushima | |
| 8,604,494 B2 * | 12/2013 | Matsushima | 257/89 |
| 8,604,495 B2 | 12/2013 | Matsushima | |
| 8,901,546 B2 | 12/2014 | Matsushima | |
| 8,907,358 B2 | 12/2014 | Matsushima | |
| 2003/0146692 A1 * | 8/2003 | Uchida | 313/504 |
| 2005/0196526 A1 * | 9/2005 | Ishida | 427/66 |
| 2005/0264182 A1 * | 12/2005 | Seki | 313/503 |
| 2005/0268984 A1 * | 12/2005 | Seki et al. | 141/1 |
| 2006/0017671 A1 * | 1/2006 | Yamada | 345/77 |
| 2007/0098879 A1 * | 5/2007 | Makiura | 427/66 |
| 2007/0153371 A1 * | 7/2007 | Cha et al. | 359/373 |
| 2008/0023695 A1 * | 1/2008 | Cho et al. | 257/40 |
| 2009/0278450 A1 | 11/2009 | Sonoyama et al. | |
| 2011/0018007 A1 | 1/2011 | Kasahara et al. | |
| 2011/0108880 A1 | 5/2011 | Yanagihara | |
| 2013/0001594 A1 * | 1/2013 | Crankshaw et al. | 257/79 |
| 2013/0285026 A1 * | 10/2013 | Miskiewicz et al. | 257/40 |
| 2014/0048883 A1 * | 2/2014 | Ukeda et al. | 257/347 |
| 2014/0145157 A1 * | 5/2014 | Kim et al. | 257/40 |
| 2014/0147950 A1 * | 5/2014 | Choi et al. | 438/46 |
| 2015/0001486 A1 * | 1/2015 | KIM et al. | 257/40 |
| 2015/0044805 A1 * | 2/2015 | Ishino et al. | 438/46 |

FOREIGN PATENT DOCUMENTS

| | | | | |
|---|---|---|---|---|
| JP | 2009-070704 | | 4/2009 | |
| JP | 2009-104859 | | 5/2009 | |
| JP | 2009-135053 | | 6/2009 | |
| JP | 2009-218156 | | 9/2009 | |
| JP | 2009-272150 | | 11/2009 | |
| JP | 2011-103222 | | 5/2011 | |
| JP | 2013-084553 | | 5/2013 | |
| WO | WO 2006/041027 | * | 4/2006 | H01L 51/50 |

* cited by examiner

ORGANIC ELECTRONIC DEVICE MANUFACTURING METHOD AND ORGANIC EL DEVICE MANUFACTURING METHOD

TECHNICAL FIELD

The present invention relates to organic electronic device manufacturing methods and organic EL (electroluminescence) device manufacturing methods, and in particular to an organic electronic device manufacturing method and organic EL device manufacturing method using a coating method when forming organic functional films.

BACKGROUND ART

In recent years, progress has been made in the research and development of application of a coating method such as an inkjet method to an organic electronic device manufacturing method and an organic EL device manufacturing method. Formation of organic functional films by using a coating method is flexible to increase in size of devices in the future, compared to the case of using a vacuum film-forming method such as a vapor deposition method, and is therefore advantageous for volume production.

In the case of manufacturing an organic electronic device or an organic EL device using film formation by a coating method, a bank is formed so as to surround an area on which the film is to be formed, and organic functional material ink is applied within the aperture defined by the bank. In this case, a problem (hereinafter, "climbing phenomenon") would occur, in which the upper edge of the organic functional material ink applied within the aperture remains at a higher position than a predetermined position on the surface of the sidewall of the bank facing the aperture. In other words, the upper edge of the organic functional material ink would be located closer to the upper edge of the opening.

If such a climbing phenomenon occurs, it would be impossible to ensure the desired device performance. Specifically, if the climbing phenomenon occurs during the process of manufacturing an electronic device having a plurality of organic functional films within an aperture, and electrodes are provided to sandwich the organic functional films, the order of the organic functional films would deviate from the design specification, and a leak current path could be formed. Therefore, if such a phenomenon occurs, it would be impossible to ensure the desired device performance.

Patent Literatures 1 and 2 disclose technology of preventing the occurrence of such a climbing phenomenon. According to the technology disclosed in Patent Literature 1, a first bank surrounding an aperture is formed, and after applying organic functional ink within the aperture, a second bank is formed so as to cover the surface of the sidewall of the bank facing the aperture and a portion of the organic functional layer formed on the surface of the sidewall, and then another drip of the organic functional ink is applied within the aperture surrounded by the second bank.

According to the technology disclosed in Patent Literature 2, a second bank having a smaller cross-section than a first bank is layered on the first bank such that the portion (stair-shape portion) of the upper surface of the first bank that is not covered with the second bank has a higher degree of liquid-repellency than the surfaces of the first bank other than the stair-shape portion and the surfaces of the second bank, aiming to prevent the occurrence of the climbing phenomenon.

CITATION LIST

Patent Literature

[Patent Literature 1] Japanese Patent Application Publication No. 2009-104859
[Patent Literature 2] Japanese Patent Application Publication No. 2011-103222

SUMMARY OF INVENTION

Technical Problem

However, the technologies disclosed in Patent Literatures 1 and 2 still have problems in achieving excellent device performance. Specifically, according to the technology disclosed in Patent Literature 1, the proportion in size of the aperture to the entire device is reduced, because the sidewall of the first bank is covered with the second bank. Such a reduction in size of the aperture is not acceptable, because, in the case of organic EL devices for example, it leads to the reduction in size of the light-emission area.

With regard to the technology disclosed in Patent Literature 2, which aims to prevent the occurrence of the climbing phenomenon by adjusting liquid-repellency of the stair-shape portion of the upper surface of the first bank, the inventors found that the climbing phenomenon actually occurred even with this technology, and the upper edge of the organic functional ink remains at a high position on the sidewall of the second bank facing the aperture. Thus, this technology cannot surely prevent the occurrence of the climbing phenomenon.

The present invention is made in view of the above-described problems, and aims to provide an organic electronic device manufacturing method and organic EL device manufacturing method that realize excellent device performance.

Solution to Problem

The organic electronic device manufacturing method pertaining to one aspect of the present invention includes the following steps:

(A) A first electrode formation step of forming a first electrode on a substrate;
(B) A first bank formation step of forming, on the substrate, a first bank defining a first aperture, such that at least a portion of the first electrode is exposed at a bottom of the first aperture;
(C) A first organic functional film formation step of forming a first organic functional film by applying a droplet of a first ink into the first aperture, the first ink containing a first organic material;
(D) A second bank formation step of forming, on the first bank, a second bank defining a second aperture, performed after the first organic functional film formation step, the second aperture communicating with the first aperture;
(E) A second functional film formation step of forming a second organic functional film by applying a droplet of a second ink into the second aperture so as to cover a surface of an exposed portion of the first organic functional film, the second ink containing a second organic material differing from the first organic material; and
(F) A second electrode formation step of forming a second electrode on the second organic functional film.

In the second bank formation step included in the manufacturing method pertaining to the present aspect, the second bank is formed such that, in plan view, a bottom edge of a sidewall surface of the second bank facing the second aperture is located at the same position as or is set back from a bottom edge of a sidewall surface of the first bank facing the first aperture.

Furthermore, in the second organic functional film formation step, the droplet of the second ink is applied such that an upper edge of the second organic functional film within the second aperture is located at a same level as or at a higher level than the bottom edge of the sidewall surface of the second bank.

Effects of Invention

The manufacturing method pertaining to the above-described aspect effectively prevents the occurrence of leak current, thereby realizing manufacturing of an organic electronic device achieving excellent device performance.

DESCRIPTION OF EMBODIMENTS

Background Leading to Embodiments of the Present Invention (i) Qualification of Conventional Technology As described above, in the field of manufacturing of organic electronic devices such as organic EL devices, progress has been made in the research and development of application of a coating method such as an inkjet method to formation of organic functional films. The organic functional films to be formed include, for example, a pigmented film, a light-emission material film, and a semiconductor film. Formation of organic functional films by using such a coating method can be flexibly applied to devices of various sizes, and is advantageous for volume production, compared to using a vapor deposition method, for example.

When forming organic functional films by using a coating method, first a bank is formed on a substrate, and then organic functional material ink is applied (dripped) within an aperture defined by being surrounded by the bank. Adoption of such a method allows for proper formation of the organic functional films in predetermined areas.

It is known that a droplet of ink applied within the aperture would remain at a high position on the sidewall of the bank surrounding the aperture. If such a climbing phenomenon occurs during the film formation, it would be impossible to ensure the desired device performance, as described above.

The inventors of the present invention conducted intense studies as to how to prevent the degradation in device performance due to the climbing phenomenon.

First, the inventors conducted studies as to whether any well-known technology would be applicable or not, and whether it would be possible to solve the problems by applying minor changes in design to the well-known technology. The following explains the results of the studies, particularly about the technologies disclosed in Patent Literatures 1 and 2 from among various well-known technologies that were considered.

Figure 10:
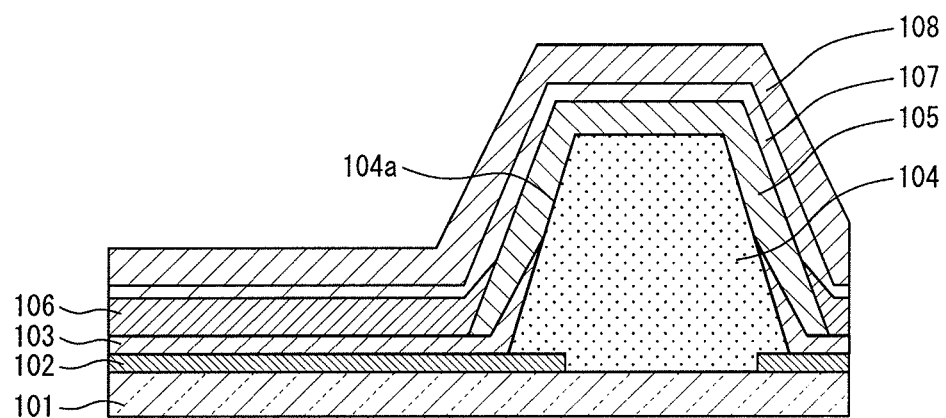
FIG. 10 is a cross-sectional view showing a portion of an organic EL device manufactured by a manufacturing method pertaining to a conventional technology.

Patent Literature 1 discloses a technology that aims to prevent the degradation in device performance due to the climbing phenomenon by adoption of the configuration shown in FIG. 10.

First, as shown in FIG. 10, lower electrodes 102 are formed on a substrate 101. Then, a layer of first bank 104 is formed on an area between each pair of adjacent lower electrodes 102 and end portions of the lower electrodes 102. Subsequently, a hole injection layer 103, which is a first organic functional film (an electrically-conductive organic functional film), is formed by a coating method, within an aperture defined by being surround by the first bank 104. At this stage, the upper edge of the hole injection layer 103 would, in some cases, remain at a high position on the sidewall surface 104a.

According to the technology disclosed in Patent Literature 1, a layer of second bank 105 is formed in case that the upper edge of the hole injection layer 103 would remain at a high position on the sidewall surface 104a of the bank 104, so that the second bank 105 covers the upper surface and the sidewall surface 104a of the bank 104 and also the portions of the hole injection layer 103 remaining at a high position on the sidewall surface 104a. Subsequently, an organic light-emitting layer 106, an electron transport layer 107 and an upper electrode 108 are sequentially formed.

Certainly, application of the above-described method disclosed in Patent Literature 1 prevents the occurrence of leak current paths between the hole injection layer 103 and the upper electrode 108.

However, the technology disclosed in Patent Literature 1 reduces the area on which the light-emitting layer 106 is to be formed, because the first bank 104 is covered with the second bank 105. Therefore, this technology is not acceptable, from the viewpoint of ensuring excellent device performance.

Note that it could be considered to reduce the width of the first bank 104 in the horizontal direction along the main surface of the substrate 101 (i.e. the horizontal direction of the drawing). However, since the first bank 104 is usually formed by using organic material mainly, the first bank 104 needs to have a relatively large width in order to maintain the shape thereof, which affects, for example, the strength of the adhesion to the substrate. In particular, the bottom of the first bank 104, located on the substrate 101, needs to have a large width. Therefore, the method of reducing the width of the first bank 104 is not acceptable.

Figure 11:
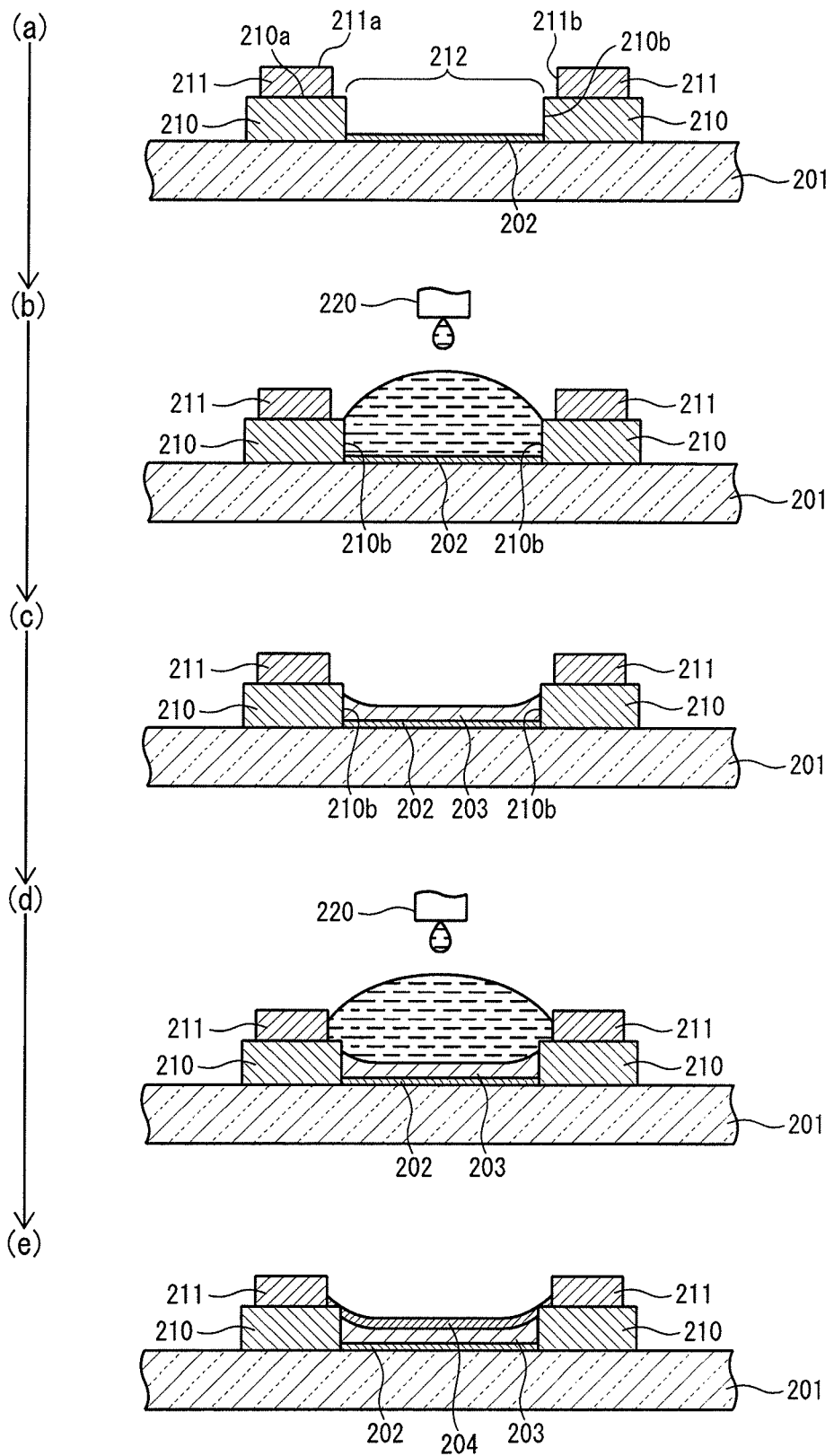
FIG. 11 is a schematic cross-sectional view showing a process of manufacturing an organic EL device pertaining to another conventional technology.
Figure 12:
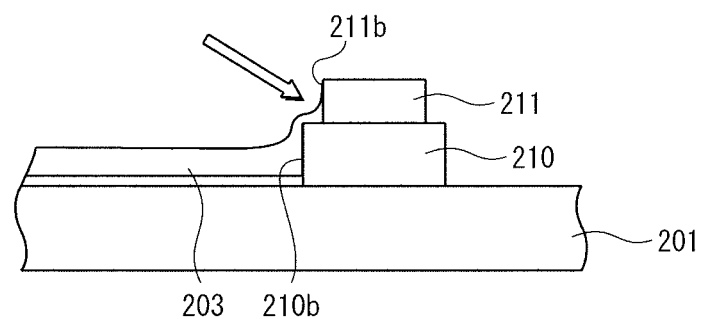
FIG. 12 is a schematic cross-sectional view illustrating problems in the organic EL device manufacturing method shown in FIG. 11, found by the inventors of the present invention.

Patent Literature 2 discloses a technology that aims to prevent the degradation in device performance due to the climbing phenomenon by adoption of the configuration shown in FIG. 11.

First, as shown in Part (a) of FIG. 11, an anode 202 is formed on a substrate 201. Then a first bank 210 is formed on an area surrounding the anode 202, and a second bank 211 having a smaller width than the first bank 210 is formed on the first bank 210. The respective upper surfaces 210a and 211a and sidewall surfaces 210b and 211b of the first bank 210 and the second bank 211 have liquid-repellency. A liquid-repellent treatment is applied to the surfaces of the first bank 210 and the second bank 211 such that the upper surfaces 210a and 211a have a higher degree of liquid-repellency than the sidewall surfaces 210b and 211b.

Subsequently, as shown in Part (b) and Part (c) of FIG. 11, ink for forming a hole injection layer 203, which is a first organic functional film (an electrically-conductive organic functional film), is dripped within the aperture 212 defined by being surrounded by the first bank 210, thereby forming the hole injection layer 203. Then, as shown in Part (d) and Part (e) in FIG. 11, intermediate functional layers 204 such as a hole transport layer are formed on the hole injection layer 203. After that, an upper electrode for example (not depicted in the drawing) is formed on the intermediate functional layer 204.

According to the Patent Literature 2, the stair-shape portion (where the second bank 211 is not layered) of the upper surface of the first bank 210 is adjusted to have a higher degree of liquid-repellency than the sidewall surfaces 210b and 211b, aiming to prevent the occurrence of the climbing phenomenon. Therefore, this technology can provide a large aperture compared to the technology disclosed in Patent Literature 1, and is considered to be advantageous in ensuring the device performance.

However, by conducting qualification of the technology disclosed in Patent Literature 2, the inventors of the present invention found that the technology cannot prevent the climbing phenomenon of the hole injection layer 203 serving as an organic functional film. Specifically, the inventors formed the hole injection layer 203 by using the technology disclosed in Patent Literature 2, and found that the pinning point of the hole injection layer 203 would be higher than the upper surface of the first bank 210 (stair-shape portion), and would be located at the sidewall surface 211b of the second bank 211, not at the sidewall surface 210b of the first bank 210. Accordingly, the inventors concluded that the technology disclosed in Patent Literature 2 cannot surely prevent the climbing phenomenon of the organic functional film on the sidewall surface of the bank.

As described above, the method disclosed in Patent Literature 1 cannot avoid reduction in size of the area where the organic functional film is to be formed, and cannot achieve organic electronic devices (including organic EL devices) with excellent device performance. Similarly, the method disclosed in Patent Literature 2 cannot surely prevent the climbing phenomenon of the organic functional film, and this method cannot achieve organic electronic devices (including organic EL devices) with excellent device performance either.

(ii) Summary of Aspects of the Present Invention

The inventors of the present invention arrived at the conclusion that in order to establish an organic electronic device manufacturing method that can effectively prevent the occurrence of leak current paths and can realize excellent device performance, it would be necessary to revolutionize conventional methods, while taking into consideration increase in number of steps of the manufacturing process. After intense studies, the inventors concluded that a manufacturing method including the following sequential steps performed in the stated order is effective. That is: first, a first bank is formed, and a first organic functional film that is electrically conductive is formed; subsequently, a second bank is formed on the first bank, the second bank defining an aperture that is equal to or greater than an aperture defined by the first bank in size; and then a second organic functional film is formed.

The first important point of the manufacturing method pertaining to the conclusion obtained by the inventors of the present invention is that it is possible to control the size of the aperture (aperture size), which has an influence on the device performance such as the light-emitting characteristics, by controlling the aperture defined by the first bank, and since the second bank is formed on the first bank after the formation of the first organic functional film (the electrically-conductive organic functional film), the problem that the electrically-conductive organic functional film remains at a high position on the sidewall surface of the second bank is surely resolved.

The second important point is that the first organic functional film does not remain at a high position on the sidewall surface of the second bank, and, unlike the technology disclosed in Patent Literature 2, the width of the second bank along the horizontal direction along the main surface of the substrate only needs to be equal to or smaller than the thickness of the upper surface of the first bank such that the entire surface of the first organic functional film can be covered with the second organic functional film, and it is possible to maintain a preferable shape of the second bank.

In the case of organic EL devices for example, the area near the sidewall surface of the bank is likely to be smaller in light emission intensity than the central area of the aperture area. Therefore, the technology disclosed in Patent Literature 1 not only reduces the size of the aperture defined by the first bank 104 due to the formation of the second bank 105 coating he first bank 104, but also reduces the degree of contribution of the light-emitting layer to the light emission at the area near the sidewall of the second bank 105. This is substantially equivalent to further reduction in the aperture size.

In contrast, according to the manufacturing method pertaining to each aspect obtained by inventors from the results of the above-mentioned studies, a sufficient size is given to the aperture defined by being surrounded by the bank, and accordingly a large organic functional film can be formed therewithin, and the occurrence of the climbing phenomenon of the organic functional film is prevented. Therefore, the manufacturing method can prevent the occurrence of leak current paths, thereby achieving excellent device performance.

Outline of Aspects of the Present Invention

The organic electronic device manufacturing method pertaining to one aspect of the present invention includes the following steps (A) through (F):

(A) A first electrode formation step of forming a first electrode on a substrate;

(B) A first bank formation step of forming, on the substrate, a first bank defining a first aperture, such that at least a portion of the first electrode is exposed at a bottom of the first aperture;

(C) A first organic functional film formation step of forming a first organic functional film by applying a droplet of a first ink into the first aperture, the first ink containing a first organic material;

(D) A second bank formation step of forming, on the first bank, a second bank defining a second aperture, performed after the first organic functional film formation step, the second aperture communicating with the first aperture;

(E) A second organic functional film formation step of forming a second organic functional film by applying a droplet of a second ink into the second aperture so as to cover a surface of an exposed portion of the first organic functional film, the second ink containing a second organic material differing from the first organic material; and (F) A second electrode formation step of forming a second electrode on the second organic functional film.

In the second bank formation step (D), the second bank is formed such that, in plan view, a bottom edge of a sidewall surface of the second bank facing the second aperture is located at the same position as or is set back from a bottom edge of a sidewall surface of the first bank facing the first aperture.

Furthermore, in the second organic functional film formation step (E), the droplet of the second ink is applied such that an upper edge of the second organic functional film within the second aperture is located at a same level as or at a higher level than the bottom edge of the sidewall surface of the second bank.

Organic electronic devices manufactured by the manufacturing method pertaining to the above-described aspect are not limited to particular devices. For example, organic EL devices and organic thin-film transistors can be manufactured by the method.

In the above-described aspect, the first organic functional film is a functional film having electrical conductivity, which is at least $10^{-7}$ S/cm at room temperature. The second organic functional film does not have the electrical conductivity in terms of the above-described definition. The size of each of the first aperture and the second aperture is defined as referring to the size of the area (i.e. aperture area) surrounded by the periphery of the bottom of each aperture.

As described in [Background Leading to Embodiments of The Present Invention], the organic electronic device manufacturing method pertaining to the present aspect includes the steps (A) through (F) which are sequentially performed. The second bank is formed on the first bank such that, in plan view, the periphery of the bottom of the second aperture is located at the same position as or is set back from the periphery of the bottom of the first aperture. In other words, the size of the bottom area of the second aperture (i.e. the size of the aperture area) defined by being surrounded by the second bank is formed so as to be the same as or greater than the size of the bottom area of the first aperture (i.e. the size of the aperture area) defined by being surrounded by the first bank.

In the first organic functional film formation step (C) in the above-described aspect, the first organic functional film is formed so as to have a continuous planer shape covering an exposed portion of the first electrode within the first aperture and at least a portion of the sidewall surface of the bank facing the first aperture.

According to conventional methods, for example because of a given degree of liquid-repellency given to the sidewall surface of the first bank aimed at prevention of the climbing phenomenon, there would be an area, near the sidewall, where the exposed portion of the first electrode is not covered.

However, according to the manufacturing method pertaining to the above-described aspect, even if the climbing phenomenon occurs on the sidewall of the first bank during the forming of the first organic functional film, the upper edge of the first organic functional film cannot be located on the sidewall surface of the second bank, because the second bank is formed after the forming of the first organic functional film. Therefore, the method pertaining to the above-described aspect surely prevents the occurrence of the leak current paths, even though the first organic functional film is formed by applying a certain amount, determined according to the film thickness, of the first ink is dropped into the first aperture so as to have a continuous planer shape covering an exposed portion of the first electrode within the first aperture and at least a portion of the sidewall surface of the bank.

Note it suffices that the first organic functional film having electrical conductivity is formed so as to cover at least a portion of the sidewall surface of the first bank, and, for example, may be formed to cover the entire sidewall surface. Furthermore, the first organic functional film may be formed to run upon the top surface of the first bank.

However, when the first organic functional film is formed to run upon the upper surface of the first bank and the organic functional film is formed within the adjacent aperture with the first bank therebetween, the first organic functional film would be in contact with the organic functional film ion the adjacent aperture. Therefore, it is preferable that the first organic functional film be formed so as not to reach the upper surface of the first bank.

In the above-described aspect, even if the first organic functional film is formed so as not to reach the top surface of the first bank, droplets of the ink would fly to and remain on the top surface of the first bank, and accordingly minute objects composed of the same material as the first organic functional film having the electrical conductivity are inevitably formed on the upper surface of the first bank. To avoid this, the first organic functional layer is not formed on the upper surface of the first bank, which means that the first organic functional layer is not formed to be continuous from the sidewall surface.

In the second organic functional film formation step in the above-described aspect, the second organic functional film is formed to cover the surface of an exposed portion of the first organic functional film. As described above, the first organic functional film cannot reach the sidewall surface of the second bank, it is possible to easily cover the surface of the exposed portion of the electrically-conductive organic functional film by applying a given amount of the second ink into the second aperture that is the same as or greater than the first aperture in size.

In the second organic functional film formation step (E), the second organic functional film may be formed so as to cover only a portion of the upper surface of the first bank where the second bank is not formed, and not to cover the sidewall surface of the second bank. Alternatively, the second organic functional film may be formed so as to cover the sidewall surface of the second bank. When forming the first organic functional film so as not to reach the upper surface of the first bank, it is possible to cover the first organic functional with the second organic functional film by forming the second organic functional film so as to cover only a portion of the upper surface of the first bank and so as not to reach the sidewall surface of the second bank.

However, considering maintaining the shape of the second bank, the portion (i.e. the stair-shape portion) of the upper surface of the first bank where the second bank is not formed cannot be sufficiently large. For this reason, even if the amount of the second ink to be dropped is restricted, there is concern that the upper edge of the droplet of the second ink applied onto the upper surface of the first bank would recede to the sidewall surface of the first bank. Therefore, it is preferable that the second organic functional film be formed so as to cover at least a portion of the sidewall surface of the second bank.

Regarding the first bank and the second bank, note that the heights, and the widths in the horizontal direction along the main surface of the substrate, are determined for the organic electronic devices to be manufactured. For example, in the case of organic EL devices, the maximum height of the first bank is no less than 100 nm and no greater than 2000 nm, preferably no less than 200 nm and no greater than 1000 nm, and the maximum height of the second bank is no less than 200 nm and no greater than 5000 nm, preferably no less than 500 nm and no greater than 2000 nm. This configuration ensures preferable shapes of the first bank and the second bank.

In the organic electronic device manufacturing method pertaining to the above-described aspect, the contact angle of the droplet of the first ink relative to the sidewall surface of the first bank facing the first aperture may be substantially the same as the contact angle of the droplet of the second ink relative to the sidewall surface of the second bank facing the second aperture.

In the second organic functional film formation step (E), the second organic functional film is formed to cover the surface of an exposed portion of the electrically-conductive organic functional film. In this step, if the difference between the contact angle of the droplet of the first ink relative to the sidewall surface of the first bank and the contact angle of the droplet of the second ink relative to the sidewall surface of the second bank is large, the first organic functional film and the second organic functional film to be formed are likely to be greatly different in shape near the sidewall surfaces. Therefore, when optimizing the conditions for forming the second organic functional film for covering the surface of the exposed portion of the surface of the first organic functional film, it would be difficult in some cases to adjust the amount of the second ink to be applied, the conditions for evaporating and drying the solvent contained in the second ink, and so on. Considering the above, it is possible to more easily form the second organic functional film by setting the contact angle of the droplet of the first ink relative to the sidewall surface of the first bank and the contact angle of the droplet of the second ink relative to the sidewall surface of the second bank to be sustainably the same.

The contact angle of a droplet of ink relative to the sidewall surface of the bank can be adjusted by selecting the type of ink, the material of the bank, the type of the liquid-repellent treatment applied to the sidewall surface, and so on. However, it is difficult to set the contact angle of the droplet of the first ink relative to the sidewall surface of the first bank and the contact angle of the droplet of the second ink relative to the sidewall surface of the second bank to be completely the same. For this reason, the expression "substantially the same" is used in the above, and this expression defines a situation where the difference between the contact angles is no greater than 10° when measured by the same measuring instrument. Also in terms of measurement error, it is difficult to bring the contrast between the contact angles if the difference is no greater than 10°, and therefore the contact angles with a difference no greater than 10° are considered to be "substantially the same".

In the organic electronic device manufacturing method pertaining to the above-described aspect, the first bank formation step (B) may include the following sub-steps (B-1) and (B-2).

(B-1) A sub-step of forming, on the substrate, the first bank film containing a first bank material.

(B-2) A sub-step of forming the first aperture by exposing a portion of the first bank film to light and developing the first bank film by using a first developer.

Also, the second bank formation step (D) may include the following sub-steps (D-1) and (D-2).

(D-1) A sub-step of forming a second bank film on the first bank and the first organic functional film, the second bank film containing a second bank material.

(D-2) A sub-step of forming the second aperture by exposing a portion of the second bank film to light and developing the second bank film by using a second developer.

In the sub-step (D-1), a material that is etchable by using the second developer is used as the second bank material, the first organic functional film being resistant to etching using the second developer.

Although both the first bank and the second bank can be formed by a well-known method, a photolithography method is preferable in terms of the processing accuracy and the efficiency in manufacturing. When using a photolithography method, it is necessary to apply a resist material containing the bank material on the substrate, to place a mask on the substrate according to the pattern of the bank to be formed to expose the resist material to light, and then to develop the material by using developer.

In the manufacturing method pertaining to the above-described aspect, first, the first bank is formed, second, the first organic functional film is formed, and finally, the second bank is layered on the upper surface of the first bank. Therefore, depending on the type of the etchant used for the development in the forming of the second bank, the first organic functional layer as an underlayer could be etched. It is possible to prevent the first organic functional film from being etched by controlling the density of the solvent of the etchant, the processing temperature, the processing time, and so on. In organic electronic devices, the film thickness of functional films such as the first organic functional film is extremely small, and is on the order of nanometers, for example. Therefore, the problem that the first organic functional film could be etched by the etchant used for the development performed during the formation of the second bank is vitally important for the organic electronic device manufacturing methods pertaining to aspects of the present invention.

In conventional methods, the first bank and the second bank can be formed from a bank material that can be etched by using the same developer, and the development for forming the first bank and the second bank can be performed by a single development step.

In the organic electronic device manufacturing method pertaining to the above-described aspect, however, the first organic functional film formation step (C) is performed between the first bank formation step (B) and the second bank formation step (D), and it is impossible to perform the development related to the first bank and the second bank by a single step. This could be a problem in terms of manufacturing efficiency. However, it is not necessary that the bank material for forming the first bank and the bank material for forming the second bank can be etched by the same developer.

Therefore, in the above-described aspect, the second bank material is selected from materials other than the first bank material, particularly from materials that is etchable by using the second developer, the first organic functional film being resistant to etching by using the second developer. This makes it easy to manage the processing temperature and processing time related to the etching during the development performed for forming the second bank, and surely prevents the first organic functional film from being etched.

The second bank material may be freely selected from well-known materials according to the material of the first organic functional film and the material of the solution of the second developer which are selected according to needs.

In the organic electronic device manufacturing method pertaining to the above-described aspect, in the sub-step (B-2) in the first bank formation step (B), alkaline developer may be used as the first developer, and in the sub-step (D-2) in the second bank formation step (D), aqueous developer may be used as the second developer.

When forming a bank by a photolithography method, alkaline developer is usually used for development.

However, it is possible to use aqueous developer when selecting appropriate resist materials including the bank material. Considering this, in the above-described aspect, an alkaline developer is used in the sub-step (B-2) in the first bank formation step (B), whereas aqueous developer is used in the sub-step (D-2) in the second bank formation step (D). This makes it easy, during the development performed in the sub-step (D-2) in the second bank formation step (D), to manage the processing temperature and processing time related to the etching, and more surely prevents the first organic functional film from being etched.

In the organic electronic device manufacturing method pertaining to the above-described aspect, the first bank formation step (B) may include the following sub-step.

(B-3) A first liquid-repellent treatment application sub-step of applying a liquid-repellent treatment to a surface (the upper surface or the sidewall surface) of the first bank.

Also, the first bank formation step (D) may include the following sub-step.

(D-3) A second liquid-repellent treatment application sub-step of applying a liquid-repellent treatment to a surface (the upper surface or the sidewall surface) of the second bank.

In the first liquid-repellent treatment application sub-step (B-3), the liquid-repellent treatment may be performed such that the upper surface of the first bank has a first contact angle relative to the droplet of the first ink, and the sidewall surface of the first bank facing the first aperture has a second contact angle relative to the droplet of the first ink, the first contact angle being greater than the second contact angle.

In the second liquid-repellent treatment application sub-step (D-3), the liquid-repellent treatment may be performed such that the upper surface of the second bank has a third contact angle relative to the droplet of the second ink, and the sidewall surface of the second bank facing the second aperture has a fourth contact angle relative to the droplet of the second ink, the third contact angle being greater than the fourth contact angle.

Each aperture defined by being surrounded by a bank is provided for receiving a predetermined amount of ink, thereby forming a predetermined organic functional film therewithin. Therefore, usually, a liquid-repellent treatment is applied to the surface of the bank in order to prevent the ink, while spreading, from running over the upper surface of the bank and reaching the adjacent aperture or climbing the sidewall surface of the bank.

In the above-described aspect, a liquid-repellent treatment is applied to the surfaces of the first bank and the second bank in order to provide the surfaces with liquid-repellency. Note that when the contact angle of a surface of a bank relative to the same ink increases as the degree of the liquid-repellency of the surface increases. Therefore, it is preferable that the degree of repellency given to the bank surfaces be adjusted appropriately according to the types of the first ink and the second ink. Specifically, with respect to the first bank, as described above, the liquid-repellent treatment is performed such that the contact angle (i.e. the first contact angle) of the upper surface of the first bank relative to the droplet of the first ink will be greater than the contact angle (i.e. the second contact angle) of the sidewall surface of the first bank relative to the droplet of the first ink. By this liquid-repellent treatment, the droplet of the first ink applied within the first aperture defined by being surrounded by the first bank is relatively unlikely to spread on the top surface of the first bank compared to on the sidewall surface thereof. Therefore, this configuration prevents the ink from forming a shape running over the top surface of the first bank, and allows the ink to have a shape covering the entire area of the exposed portion of the first electrode. Thus, the stated configuration makes it easier to form the first organic functional film.

With respect to the second bank, as described above, the liquid-repellent treatment is performed such that the contact angle (i.e. the third contact angle) of the upper surface of the second bank relative to the droplet of the second ink will be greater than the contact angle (i.e. the fourth contact angle) of the sidewall surface of the second bank relative to the droplet of the second ink. By this liquid-repellent treatment, the droplet of the second ink applied within the second aperture defined by being surrounded by the second bank is relatively unlikely to spread on the top surface of the second bank compared to on the sidewall surface thereof. Therefore, this configuration prevents the ink from forming a shape running over the top surface of the second bank, and allows the ink to have a shape covering the area of the exposed portion of the first organic functional film. Thus, the stated configuration makes it easier to form the second organic functional film.

In the organic electronic device manufacturing method pertaining to the above-described aspect, in the sub-step (B-3) and the sub-step (D-3), the liquid-repellent treatment may be applied to the first bank and the second bank such that the third contact angle is greater than the fourth contact angle, the fourth contact angle is greater than the first contact angle, and the first contact angle is greater than the second contact angle.

In the above-described aspect, by determining the magnitude relationship among the contact angles as described above, the liquid-repellency of the surfaces of the first bank and the second bank can be increased from the bottom of the first aperture to the top of the second aperture. Here, if the liquid-repellent treatment is performed such that the contact angle will be too large, the organic functional film could be formed without covering the surface of the underlayer.

On the other hand, if the liquid-repellent treatment is performed such that the contact angle will be too small, the organic functional film could be formed to reach a too high point on the sidewall surface of the bank, and the cross section of the organic functional film could have a depression and unlikely to have uniform thickness.

Comparing the first bank with the second bank, when the organic functional film is formed without covering at least a portion of the sidewall surface of the first bank, the organic functional film is likely to be formed such that a portion of the under layer is exposed, and such a configuration directly results in degradation of the device performance. On the other hand, even when the organic functional film is formed without covering at least a portion of the sidewall surface of the second bank, such a configuration does not directly result in degradation of the device performance as long as at least the upper surface or the sidewall surface of the first bank is covered with the organic functional layer. Therefore, it is preferable that the sidewall surface of the second bank be given a larger degree of liquid-repellency than the sidewall surface of the first bank.

In addition, if the upper surface of the first bank is given a higher liquid-repellency than the sidewall surface of the second bank, there is a possibility that the organic functional film to be formed could have a not continuous film shape, that is, the organic functional film would not cover the upper surface of the first bank and cover the sidewall surface of the second bank. Therefore, it is preferable that the sidewall surface of the second bank be given a larger degree of liquid-repellency than the upper surface of the first bank.

As described above, by defining the magnitude relationship among the contact angles, it becomes easier to form an organic functional film having a uniform film thickness, without forming an exposed portion in the underlayer.

In the organic electronic device manufacturing method pertaining to the above-described aspect, in the sub-step (B-1) in the first bank formation step (B), the first bank film may be formed to have a liquid-repellent surface by using a liquid-repellent material as the first bank material. Similarly, in the sub-step (D-1) in the second bank formation step (D), the second bank film may be formed to have a liquid-repellent surface by using a liquid-repellent material as the second bank material.

Examples of well-known liquid-repellent treatments for giving liquid-repellency to surfaces of banks include a method of forming a bank by using a bank material having a liquid-repellency, for example using a bank material containing fluorine-containing resin having a liquid-repellency, and a method of applying a liquid-repellent treatment to banks that have already been formed, for example by applying a fluorine plasma treatment to surfaces of banks that have already been formed.

The liquid-repellent treatment used in the manufacturing method pertaining to the above-described aspect could be any of conventional technologies, and is not limited to any particular method.

However, in terms of manufacturing efficiency, it is preferable that the liquid-replant treatment method using a bank material having a liquid-repellency be adopted. Considering this, in the sub-steps (B-1) and (D-1) of the manufacturing method pertaining to the above-described aspect, the first bank and the second bank may be respectively formed from a first bank material and a second bank material each having a liquid-repellency.

In the first organic functional film formation step (C) in the organic electronic device manufacturing method pertaining to the above-described aspect, the first organic functional film may be formed such that an upper edge thereof does not reach the upper surface of the first bank.

The first organic functional film having electrical conductivity may be formed to reach the upper surface of the first bank. If this is the case, the upper edge of the first organic functional film and the vicinity thereof will be sandwiched between the upper surface of the first bank and the lower surface of the second bank.

However, in the horizontal direction along the main surface of the substrate, when forming the organic functional film also within the adjacent aperture with the first bank therebetween, there is a concern that portions of the organic functional film sandwiched between the boarders of the first bank and the second bank would be connected together. Considering this concern, it is preferable that organic functional film be formed such that the upper edge of the first organic functional film does not reach the upper surface of the first bank.

An organic EL device manufacturing method pertaining to one aspect of the present invention includes the following steps (AA) through (FF):

(AA) A first electrode formation step of forming a first electrode on a substrate;

(BB) A first bank formation step of forming, on the substrate, a first bank defining a first aperture, such that at least a portion of the first electrode is exposed at a bottom of the first aperture;

(CC) A first organic functional film formation step of forming a first organic functional film by applying a droplet of a first ink into the first aperture, the first ink containing a first organic material;

(DD) A second bank formation step of forming, on the first bank, a second bank defining a second aperture, performed after the first organic functional film formation step, the second aperture communicating with the first aperture;

(EE) A second organic functional film formation step of forming a second organic functional film by applying a droplet of a second ink into the second aperture so as to cover a surface of an exposed portion of the first organic functional film, the second ink containing a second organic material differing from the first organic material; and (FF) A second electrode formation step of forming a second electrode on the second organic functional film.

In the second bank formation step (DD), the second bank is formed such that, in plan view, a bottom edge of a sidewall surface of the second bank facing the second aperture is located at the same position as or is set back from a bottom edge of a sidewall surface of the first bank facing the first aperture.

Also, in the second organic functional film formation step (EE), the droplet of the second ink is applied such that an upper edge of the second organic functional film within the second aperture is located at a same level as or at a higher level than the bottom edge of the sidewall surface of the second bank.

Furthermore, in the first organic functional film formation step (CC), a laminate including a carrier injection layer and a carrier transport layer is formed as the first organic functional film, and in the second organic functional film formation step (EE), a light-emitting layer is formed as the second organic functional film, the light-emitting layer causing electroluminescence by recombination of holes and electrons.

When a hole transport layer or a carrier transport layer which serves as an electron transport layer are included as components of the device, these components may have electrical conductivity that is smaller than the electrical conductivity of the carrier injection layer but is substantially equivalent to the electrical conductivity of the first organic functional film.

Considering this, it is meaningful to apply the organic electronic device manufacturing method pertaining to the above-described aspect to manufacturing of organic EL devices.

The manufacturing method pertaining to the present aspect surely prevents occurrence of leak current paths, and allows for manufacturing of an organic EL device with excellent device performance.

Embodiment 1

1. Method of Manufacturing Organic Electronic Device 71

Figure 1:
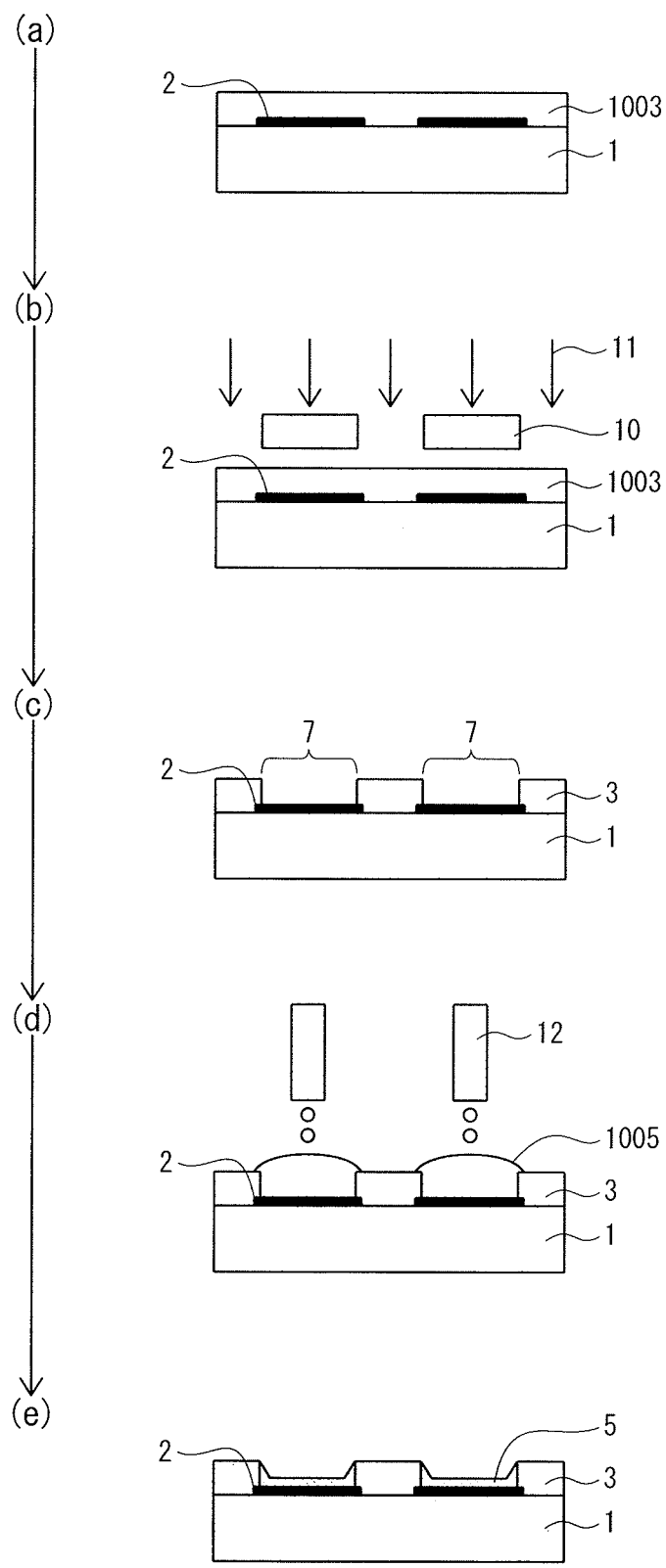
FIG. 1 is a schematic cross-sectional view showing a process of manufacturing an organic electronic device pertaining to Embodiment 1 of the present invention.
Figure 2:
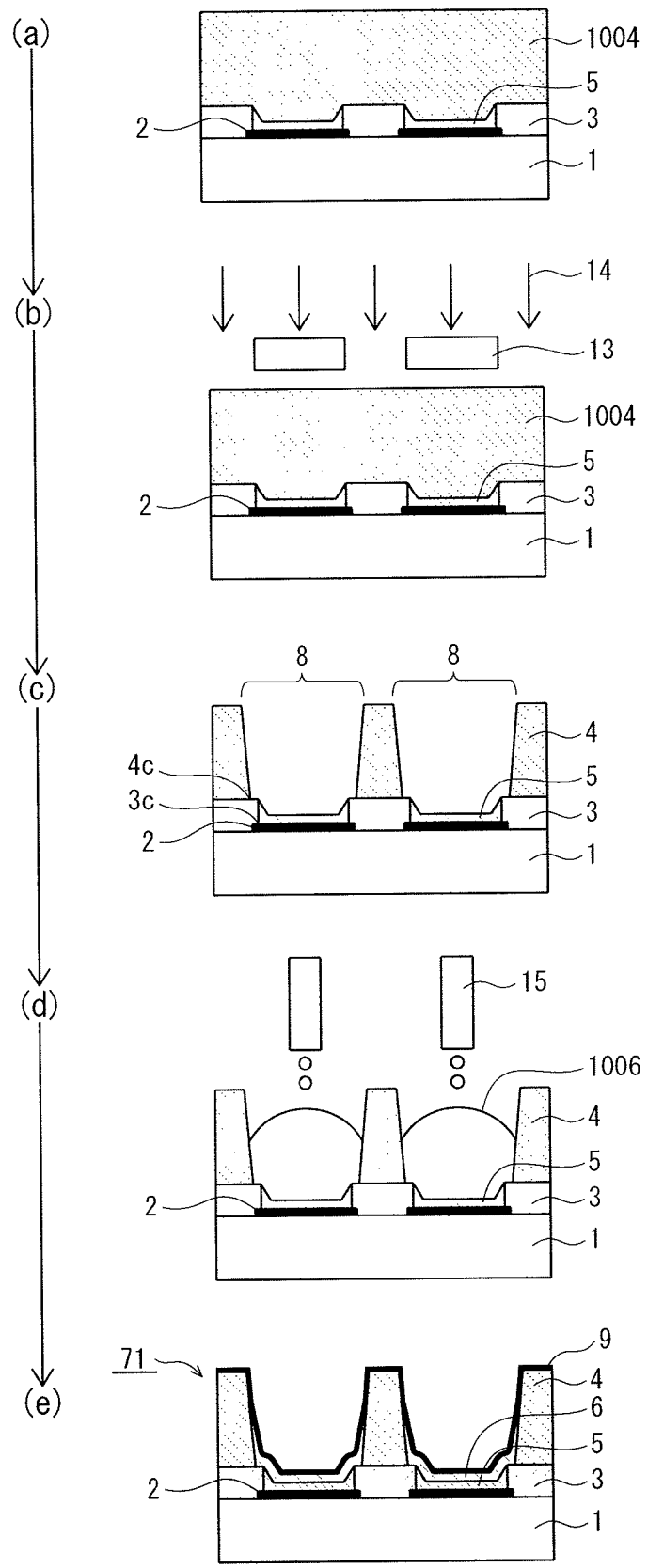
FIG. 2 is a schematic cross-sectional view showing a process of manufacturing an organic electronic device pertaining to Embodiment 1 of the present invention.

The following describes a method of manufacturing an organic electronic device 71 pertaining to Embodiment 1, with reference to FIG. 1 and FIG. 2. FIG. 1 and FIG. 2 are schematic cross-sectional views showing a process of manufacturing an organic electronic device 71 pertaining to the present embodiment. In the following, for the sake of convenience, the process of manufacturing the organic electronic device 71 pertaining to the present embodiment is divided into steps, namely "a first electrode formation step", "a first bank formation step", "a first organic functional layer formation step", "a second bank formation step", "a second organic functional film formation step" and "a second electrode formation step".

Note that any additional steps may be included besides the steps adopted in the present embodiment, in order to manufacturing the components of various sorts of organic electronic devices. However, such components can be manufactured by a well-known method.

<First Electrode Formation Step>

As shown in Part (a) in FIG. 1, first a substrate 1 is formed, and then first electrodes 2 are formed on the substrate 1.

The substrate 1 may be made of a well-known material such as any of various glass materials.

The first electrodes 2 may be formed by a vacuum deposition method or a sputtering method, for example. Furthermore, the first electrodes 2 may be formed by using metal material containing indium tin oxide (ITO) or indium zinc oxide (IZO) for example, which are light-transmissive electrically-conductive materials. The thickness of the first electrodes 2 may be set to approximately 150 nm.

<First Bank Formation Step>

Subsequently, as shown in Part (a) through Part (c) of FIG. 1, a first bank 3 is formed between the adjacent first electrodes 2 on the substrate 1 and the edges of the first electrodes 2.

<<First Bank Film Formation Sub-Step>>

As shown in Part (a) of FIG. 1, a first bank film 1003 is layered on the substrate 1 including the area where the first electrodes 2 are formed. As the bank material used for the formation of the first bank film 1003, photosensitive resin material made of well-known resist material such as acrylic resin, polyimide resin or phenolic resin and having liquid-repellency may be adopted.

The first bank film 1003 may be formed by using a spin coat method, for example. The film thickness of the first bank film 1003 may be set to approximately 500 nm, for example.

<<Liquid-Repellent Treatment Sub-Step>>

Subsequently, heat treatment at 100° C. for example is applied to the first bank film 1003 that has been layered. Due to this heat treatment, the liquid-repellent component contained in the bank material moves toward the surface of the first bank film 1003 by thermophoresis. Accordingly, the density of the liquid-repellent component in the first bank film 1003 after the heat treatment gradually decreases from the surface to the inside.

Here, it is possible to control the amount of the difference between the density of the liquid-repellent component in the area near the upper surface and in the inside of the first bank film 1003 by adjusting the amount of the liquid-repellent component contained in the bank material and the temperature and duration of the heat treatment.

<<Exposure and Development Sub-Step>>

As shown in Part (b) of FIG. 1, a mask 10 is placed on the substrate 1 according to the pattern of a first aperture 7 defined so as to expose the first electrodes 2, and then exposure 11 is selectively performed.

After the exposure, as shown in Part (c) of FIG. 1, etching is applied to the first bank film 1003 by using non-aqueous developer such as alkaline developer, thereby forming the first bank 3 defining the first aperture 7.

<<Liquid-Repellent Treatment Sub-Step>>

After performing the exposure and development sub-step as described above, heat treatment at 200° C. for example is applied to the first bank 3, thereby evaporating, for example, excessive solution adhering to the surface of the first bank 3.

Thus, by performing the first bank formation step, the first bank 3 having a maximum height of approximately 500 nm can be formed.

Here, the density of the liquid-repellent component in the area of the upper surface of the first bank film 1003 and its vicinity is set higher than the inner area by performing the liquid-repellent treatment sub-step, and the first aperture 7 is provided by performing the subsequent exposure and development sub-step. Therefore, regarding the density distribution of the liquid-repellent component in the first bank 3, the density in the upper surface and its vicinity is higher than the density in the sidewall surface and its vicinity facing the first aperture 7.

Note that in the first bank formation step, any well-known technology besides the above-described technology may be used for forming the bank. For example, it is possible to control the liquid-repellency of the upper surface and the sidewall surface of the first bank 3 by first performing the exposure and development sub-step and the heat treatment sub-step without forming the liquid-repellent component distribution by performing the above-described liquid-repellent treatment sub-step, and then applying a surface treatment to the surfaces of the first bank 3 by using alkaline solution, water, or organic solvent, for example.

Furthermore, it is possible to control the liquid-repellency of the upper surface and the sidewall surface of the first bank 3 by irradiating the surfaces of the first bank 3 with fluorine plasma or ultraviolet light.

<First Organic Functional Film Formation Step>

Subsequently, as shown in Part (d) and Part (e) of FIG. 1, the first organic functional films 5 that meets the purpose of the organic electronic device are formed. For the formation of the first organic functional films 5, first, an organic functional material and a solvent is mixed in a predetermined proportion, thereby controlling the properties of the ink for forming the first organic functional film.

Then, as shown in Part (d) of FIG. 1, the ink having the controlled properties is dripped from, for example, ink jet heads 12 into the first apertures 7 by using an inkjet method, so that liquid films 1005 cover the exposed portions of the first electrodes 2 in the first apertures 7, respectively. Next, as shown in Part (c) of FIG. 1, the solvent contained in the liquid films 1005 is dried to evaporate, and is heated and baked as necessary, and thus the first organic functional films 5 are formed. Note that the first organic functional films 5 in the present embodiment are electrically-conductive films.

Furthermore, although each first organic functional film 5 in the present embodiment is formed to have a continuous planer shape covering the upper surface of the first electrode 2 and a portion of the sidewall surfaces of the first bank 3, it is possible to control the shape of the conductive organic functional film by adjusting the amount of the droplet of the ink, the processing atmosphere and processing time for drying and evaporating the solvent, the processing temperature and processing time for the heating and baking, and so on.

<Second Bank Formation Step>

Next, as shown in Part (a) through Part (c) of FIG. 2, the second bank 4 is layered on the first bank 3. In the second bank formation step of the present embodiment, as in the first bank formation step, photosensitive resin material containing liquid-repellent component is selected as the bank material for forming the second bank 4, and a photolithography method is used for the formation. However, unlike in the first bank formation step, aqueous developer is used as the developer in the developing sub-step for forming the second bank 4.

Note that as the photosensitive resin material used for forming the second bank 4, it is possible to use a well-known resist material containing cellulose derivative in which water-soluble polymer of the binder is replaced with a water-soluble group such as hydroxypropyl cellulose. Furthermore, as the liquid-repellent component, a well-known liquid-repellent material such as fluorine-containing compound material may be used.

<<Bank Film Formation Sub-Step>>

As shown in Part (a) of FIG. 2, a second bank film 1004 for forming the second bank 4 is deposited by a spin coat method so as to cover the upper surface of the first bank 3 and the first organic functional film 5. The second bank film has a film thickness of, for example, 1500 nm.

<<Liquid-Repellent Treatment Sub-Step>>

Heat treatment at 100° C. for example is applied to the second bank film 1004 that has been deposited as described above. Due to this heat treatment, the liquid-repellent component contained in the bank material moves toward the surface of the second bank film 1004 by thermophoresis. As a result of the heat treatment, the density of the liquid-repellent component in the second bank film 1004 is distributed such that the density gradually increases from the surface to the inside.

Here, as with the case of the first bank film 1003, it is possible to control the amount of the difference between the density of the liquid-repellent component in the area near the upper surface and in the inside of the second bank film 1004 by adjusting the amount of the liquid-repellent component contained in the bank material and the temperature and duration of the heat treatment.

<<Exposure and Development Sub-Step>>

As shown in Part (b) of FIG. 2, a mask 13 forming an exposure pattern that is defined to be greater in size than the first aperture 7 is placed in order to selectively perform exposure 14. The mask 13 used here has an exposure pattern that is determined so that, in plan view, the bottom edge 4c of the second aperture 8 of the second bank 4 will be set back from the bottom edge 3c of the first aperture 7 of the first bank 3.

Note that it is possible to use a mask that has a pattern that is determined so that, in plan view, the bottom edge 4c of the second aperture 8 of the second bank 4 will be located at the same position as the bottom edge 3c of the first aperture 7 of the first bank 3.

After performing the exposure process as described above, the second bank film 1004 is etched, and thus the layer of the second bank 4 surrounding and thereby defining the second aperture 8 is formed on the upper surface of the first bank 3, as shown in Part (c) of FIG. 2.

<<Liquid-Repellent Treatment Sub-Step>>

After performing the exposure and development as described above, heat treatment at 200° C. for example is applied to the second bank 4, thereby evaporating, for example, excessive solution adhering to the surface of the second bank 4.

Thus, by performing the second bank formation step, the second bank 4 having a maximum height of approximately 1500 nm can be formed, as shown in Part (c) of FIG. 2.

Here, also in the second bank formation step, the density of the liquid-repellent component in the upper surface of the second bank film 1004 is set high by performing the liquid-repellent treatment sub-step, and thereafter the second aperture 8 is formed by performing the exposure and development sub-step. Therefore, as with the first bank 3, the density in the upper surface and its vicinity will be higher than the density in the sidewall surface and its vicinity facing the second aperture 8.

Furthermore, by including a larger amount (percentage) of liquid-repellent component into the bank material use for forming the second bank film 1004 than into the bank material use for forming the first bank film 1003, it is possible to give the lowest degree of liquid-repellency to the sidewall surface of the first bank 3, followed by the upper surface of the first bank 3, the sidewall surface of the second bank 4, and the highest to the upper surface of the second bank 4.

Note that, as in the first bank formation step, the second bank 4 may be formed by any well-known method besides the above-described method.

Also note that although the first bank 3 has a square (rectangular) cross section and the second bank 4 has a trapezoidal cross section in the drawings, the respective cross-sections of the first bank 3 and the second bank 4 in reality are likely to have a gently-curved shape projecting outward, as described below with reference to FIG. 7.

An aperture defined by being surrounded by a bank is likely to have a diameter that gradually increases in the direction from the side of the substrate 1 to the upper side. Therefore, the height of each bank is determined with reference to the maximum size as described above.

Also, considering the nature that an aperture defined by being surrounded by a bank is likely to have a diameter that gradually increases in the direction from the side of the substrate 1 to the upper side, it is easy to configure the second aperture to be greater in size than the first aperture at any level, by setting the bottom edge of the second aperture of the second bank to be, in plan view, located at the same position as, or set back from, the bottom edge of the first aperture defined by being surrounded by the first bank.

<Second Organic Functional Film Formation Step>

Next, an organic functional material is prepared, that corresponds to the required function for the second organic functional film 6, and control the properties of the ink used for forming the second organic functional film 6 by mixing the organic functional material with solution in a predetermined proportion. By using an inkjet method for example, the ink having the controlled properties is dripped into the second aperture 8 from the ink jet head 15, thereby coating the exposed portions of the first organic functional films with liquid films 1006 of the ink, as shown in Part (d) of FIG. 2. Next, as shown in Part (e) of FIG. 2, the solvent contained in the liquid films 1006 is dried to evaporate, and is heated and baked as necessary, and thus the second organic functional films 6 are formed.

Although each second organic functional film 6 in the present embodiment is formed to have a continuous planer shape covering the surface of the exposed portion of the first organic functional films 5 as shown in Part (e) of FIG. 2, it is possible to control the shape of the second organic functional film 6 by adjusting the amount of the droplet of the ink, the processing atmosphere and processing time for drying and evaporating the solvent, the processing temperature and processing time for the heating and baking, and so on.

<Second Electrode Formation Step>

Next, as shown in Part (e) of FIG. 2, a second electrode 9 made of metal material is formed on the second organic functional films 6 and the exposed portions of the second bank 4 (i.e. the upper surface and a portion of the sidewall surface) by using a vacuum deposition method or a sputtering method.

The material used for forming the second electrode 9 may be a well-known metal oxide material, for example a pure metal material such as aluminum (Al), or a light-transmissive electrically-conductive material such as indium tin oxide (ITO) and indium zinc oxide (IZO).

The organic electronic device 71 can be manufactured by performing the above-described steps.

2. Effects

Figure 3:
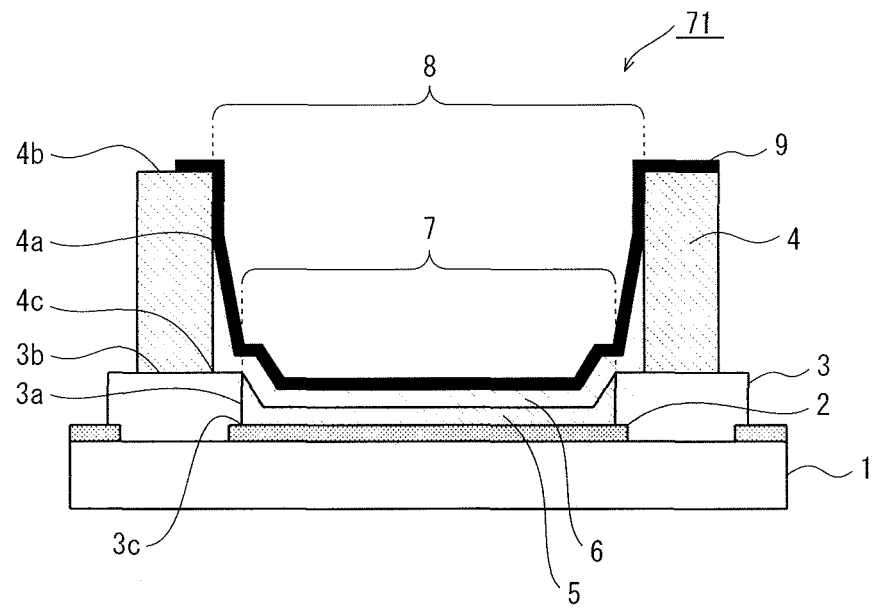
FIG. 3 is a schematic partial cross-sectional view showing a portion of an organic electronic device manufactured by a manufacturing method pertaining to Embodiment 1 of the present invention.

With reference to FIG. 3, the following describes advantageous effects that can be achieved by using the method of manufacturing the organic electronic device 71 pertaining to the present embodiment. FIG. 3 is a schematic partial cross-sectional view showing a portion of the organic electronic device 71 manufactured by the above-described method.

As shown in FIG. 3, the first organic functional film 5 having electrical conductivity is formed to cover both the upper surface of the first electrode 2 and the sidewall surface 3a of the first bank 3. According to the present embodiment, at the formation of the first organic functional film 5, only the first bank 3 exists and the second bank 4 does not exist. Therefore, there is no possibility that the first organic functional film 5 covers the sidewall surface 4a of the second bank 4.

Furthermore, in plan view, the bottom edge 4c of the second aperture 8 of the second bank 4 is set back from the bottom edge 3c of the first aperture 7 of the first bank 3. In other words, the second aperture 8 is greater in size than the first aperture 7. Therefore, it is easy to cover the entire surface of the first organic functional film 5 with the second organic functional film 6. This configuration ensures the second organic functional film 6 be inserted between the first organic functional film 5 and the second electrode 9, and surely prevents the occurrence of the leak current paths between the first organic functional film 5 and the second electrode 9.

Also in this embodiment, the "electrical conductivity" of the first organic functional film 5 is defined as being at least $10^{-7}$ S/cm at room temperature. The second organic functional film 6 does not have the "electrical conductivity" in terms of the above-described definition. Therefore, when manufacturing, for example, an organic electronic device having a laminate structure in which the first organic functional film, the second organic functional film, the first organic functional film and the second organic functional film are layered on the first electrode in this order, first, the step for forming the first bank 3 is performed, next the first organic functional film and the second organic functional film are formed in this order, then the first organic functional film is formed by performing the first organic functional film formation step, and finally the second bank formation step and the second organic functional film formation step are performed in this order.

Alternatively, after forming the first organic functional film on the substrate, the first bank is formed by performing the first bank formation step, next the second organic functional film is formed, and then the first organic functional film formation step, the second bank formation step and the second organic functional film formation step is performed in this order.

Embodiment 2

1. Configuration of Organic EL Device 70

Figure 4:
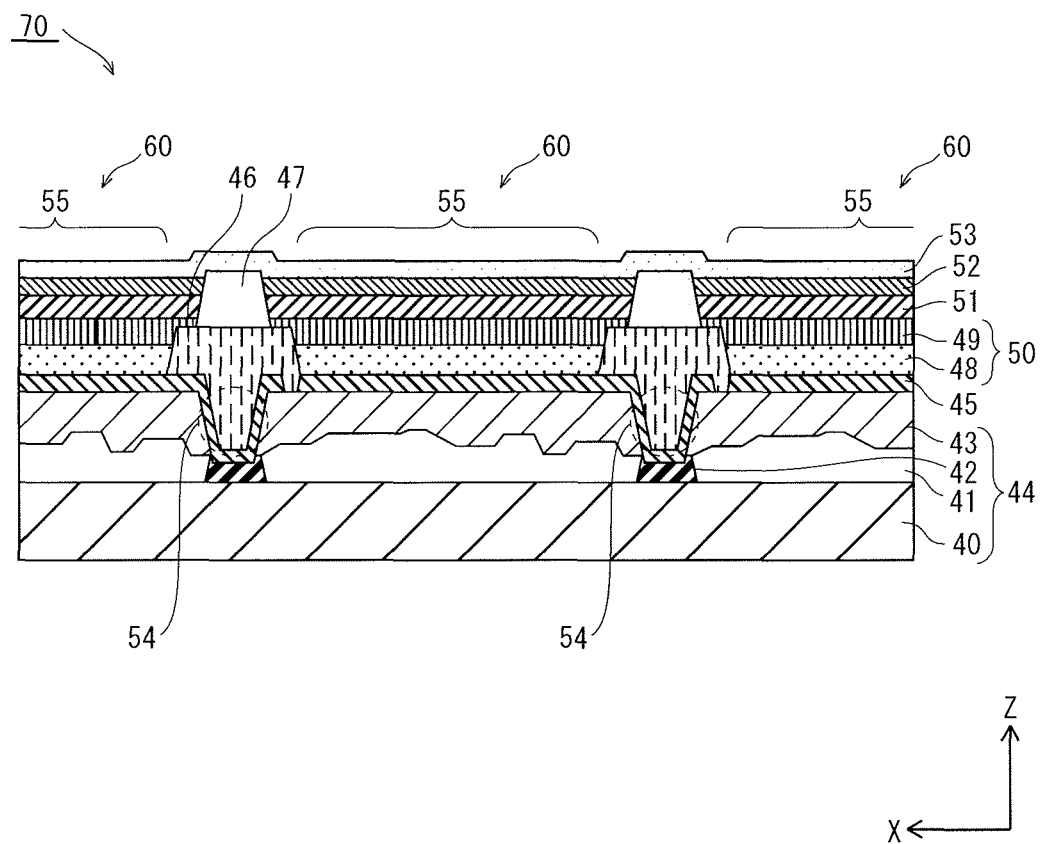
FIG. 4 is a schematic partial cross-sectional view showing a portion of an organic EL device manufactured by a manufacturing method pertaining to Embodiment 2 of the present invention.

Before explaining an organic EL device manufacturing method pertaining to the present embodiment, the following explains the configuration of an organic EL device 70 to be manufactured by the manufacturing method, with reference to FIG. 4. FIG. 4 is a schematic partial cross-sectional view showing a portion of the organic EL device 70 to be manufactured by the manufacturing method pertaining to an embodiment of the present invention.

In FIG. 4, an organic EL display panel provided with a plurality of organic EL elements 60 is adopted as an example of the organic EL device 70. However, an organic EL device including a single organic EL device can be manufactured by the method.

As shown in FIG. 4, the organic EL device 70 to be manufactured by the manufacturing method pertaining to the present embodiment is a top-emission type organic EL device.

In the organic EL device 70, a TFT (thin-film transistor) layer 41, a power supply electrode 42 and a planarizing film 43 are sequentially layered on one of main surfaces of the substrate body 40 that is the upper surface in the Z axis direction. In this embodiment, the structure including the substrate body 40, the TFT layer 41, the power supply electrode 42 and the planarizing film 43 is defined as "substrate 44".

A plurality of pixel electrodes 45 are formed above the substrate 44, which are portioned so as to correspond one-to-one to the organic EL elements 60 (i.e. correspond one-to-one to light-emitters). Between each pair of adjacent pixel electrodes 45 on the substrate 44, a first bank 46 is formed so that the first banks 46 surround the spaces above the pixel electrodes 45.

As shown in FIG. 4, a second bank 47 is layered on the upper surface of each first bank 46. The second bank 47 has a smaller width than the upper surface of the first bank 46 along the X axis direction. Each aperture 55 defined by the first banks 44 and the second banks 47 serves as a space defining a light-emitting area of the corresponding organic EL element 60.

Inside each aperture 55, a hole injection layer 48, a hole transport layer 49, a light-emitting layer 51 and an electron transport layer 52 are layered from bottom to top along the X axis direction. On the surface of the electron transport layer 52 and the upper surface of the second bank 47, a common electrode 53 extending across the plurality of organic EL elements 60 is layered. In the present embodiment, the hole injection layer 48 and he hole transport layer 49 correspond to the "first organic functional layer 50" pertaining to each of the above-described aspects, and the light-emitting layer 51 corresponds to the "second organic functional layer" pertaining to each of the above-described aspects.

The pixel electrode 45 corresponds to the "first electrode" pertaining to each of the above-described aspects, and the common electrode 53 corresponds to the "second electrode" pertaining to each of the above-described aspects The following explains the details of each component of the organic EL device 70.

<Substrate 44>

The substrate body 40 of the substrate 44 is a rear substrate of the organic EL device 70, and the surface thereof is provided with the TFT layer 41 including a thin-film transistor (TFT) for driving the organic EL device 70 by an active matrix method. The TFT layer 41 is provided with a power supply electrode 42 for supplying each TFT with external electricity.

The planarizing film 43 is provide for planarizing the steps that occur due to the formation of the TFT layer 41 and the power supply electrode 42, and is made from organic material having excellent insulation properties.

The substrate 44 including the substrate body 40, the TFT layer 41, the power supply electrode 42 and the planarizing film 43 corresponds to the "substrate" pertaining to each of the above-described aspects.

<Contact Holes>

A contact hole 54 penetrating through the planarizing film 43 along the Z axis direction is provided in order to electrically connect the power supply electrode 42 and the pixel electrode 45. The contact hole 54 is formed to penetrate the planarizing film 43 from the upper surface to the lower surface in the Z-axis direction. Each contact hole 54 is located between each pair of adjacent apertures 55 arranged along the X axis direction, and each recesses remaining after disposing the pixel electrodes 45 is embedded with the first bank 46. The recesses are planarized by the first banks 46 in this way in order to prevent occurrence of irregular light emission for example, caused by the contact holes 54 remaining as recesses not planarized.

<Pixel Electrode 45>

The pixel electrodes 45 of the present embodiment are anodes, which corresponding one-to-one to the organic EL elements 60 (i.e. corresponding one-to-one to the light-emitters). Each pixel electrode 45 is formed for one of the light-emitting layers 51 each formed within one of the apertures 55. Each pixel electrode 45 corresponds to the "first electrode" pertaining to each of the above-described aspects.

<First Bank 46 and Second Bank 47>

The bank layer composed of the first bank 46 and the second bank 47 is formed in order to prevent droplets of ink, containing light-emitting layer material corresponding to one of red (R), green (G) and blue (B) colors and solvent, from being mixed with each other when forming the light-emitting layer 51.

The bank layer composed of two layers, namely the first bank 46 and the second bank 47 is disposed in order to prevent the hole injection layer 48 having electrical conductivity from forming leak current paths with the common electrode 53.

Each of the first bank 46 disposed to cover the contact hole 54 and the second bank 47 disposed on the first bank 46 has a trapezoidal cross section along the X-Z plane. Although not depicted in the drawing, regarding each of the first bank 46 and the second bank 47, the cross section along the plane including a virtual axis that is perpendicular to the sheet of drawing and the Z axis is also trapezoidal.

<Hole Injection Layer 48>

The hole injection layer 48 is provided in order to encourage injection of holes from the pixel electrode 45 to the light-emitting layer 51.

<Hole Transport Layer 49>

The hole transport layer 49 is provided in order to control the hole injection properties of the holes injected from the pixel electrode 45 to the light-emitting layer 51.

<Light-Emitting Layer 51>

The light-emitting layer 51 is a layer that causes phenomenon of electroluminescence by recombination of holes and electrons. The light-emitting layer 51 contains light-emitting layer material that emits light having a wavelength band corresponding to red (R), green (G) or blue (B) color by recombination of carriers.

<Electron Transport Layer 52>

The electron transport layer 52 is provided in order to efficiently transport the electrons injected from the common electrode 52 serving as cathode to the light-emitting layer 51. The electron transport layer 52 can be made up from, for example, n-type dopant having electron injection properties, such as a charge transfer (CT) complex and host material having electron transport properties. Such composition can realize preferable electron transport properties.

<Common Electrode 53>

The common electrode 53 serves as a cathode, and corresponds to the "second electrode" pertaining to each of the above-described aspects.

The common electrode 53 may be formed from, for example, electrically-conductive light-transmissive material such as indium tin oxide (ITO) or indium zinc oxide (IZO), and may be layered together with a metal layer (e.g. aluminum layer) having a thickness of approximately 10 nm.

<Other Considerations>

Although not depicted in FIG. 4, a sealing layer is formed above the common electrode 53 with respect to the Z axis direction. The light-emitting layer 51 is provided in order to prevent intrusion of water, air, etc. into the light-emitting layer 51, thereby preventing degradation of the light-emitting layer 51. Since the organic EL device 70 to be manufactured by the manufacturing method pertaining to the present embodiment is a top-emission type device, it is preferable that light-transmitting material such as silicon nitride (SiN) or silicon oxynitride (SiON) is selected as the material of the sealing layer.

Also, in order to improve the adhesion between adjacent layers, it is preferable that a layer made of indium tin oxide (ITO) or indium zinc oxide (IZO) is provided between the pixel electrode 45 and the hole injection layer 48.

Furthermore, the light-emitting layer 51 formed within each aperture 55 may have a single luminescent color all over the device.

2. Materials of Each Component

The following shows example materials used for forming each of the above-described components. Note that the materials listed below are merely examples, and of course other materials may be used.

<Substrate Body 40>

The substrate body 40 may be formed with, for example, an insulating material, such as alkali-free glass, soda glass, non-fluorescent glass, phosphate glass, borate glass, quartz, acrylic resin, styrenic resin, polycarbonate resin, epoxy resin, polyethylene, polyester, silicone resin, or alumina.

<Planarizing Film 43>

The planarizing film 43 may be formed with, for example, acrylic resin or polyimide resin.

<Pixel Electrode 45>

The pixel electrode 45 may be formed with, for example, Ag (silver), Al (aluminum), alloy of silver, palladium, and copper), alloy of silver, rubidium, and gold, MoCr (alloy of molybdenum and chromium), NiCr (alloy of nickel and chromium), ITO (indium tin oxide), or IZO (indium zinc oxide).

<Bank Layer (First Bank 46, Second Bank 47)>

The first bank 46 and the second bank 47 may be formed with, for example, acrylic resin, polyimide resin, or novolac-type phenolic resin.

<Hole Injection Layer 48>

The hole injection layer 48 may be formed with, for example, a metal oxide such as MoOx (molybdenum oxide), WOx (tungsten oxide) or MoxWyOz (molybdenum-tungsten oxide), a metal nitride, or a metal oxynitrid.

<Hole Transport Layer 49>

The hole transport layer 49 may be formed with, for example, triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, hydrazone derivative, triphenylmethane derivative, or tetraphenyl benzine derivative.

<Light-Emitting Layer 51>

The light-emitting layer 51 may be formed with, for example, F8-F6 (copolymer composed of F8 (polydioctylfluorene) and F6 (polydihexylfluorene)), a fluorescent material such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, or rare earth metal complex.

<Electron Transport Layer 52>

The electron transport layer 52 may be formed with, for example, alkaline metal compound such as lithium fluoride or sodium fluoride, alkaline earth metal compound, or compound of alkaline metal or alkaline earth metal, etc. serving as n-type dopant material and bathocuproin (BCP), bathophenanthroline (Bphen), tris(8-hydroxyquinolinato)aluminum (Alq3) or napthalenetetracarboxylic dianhydride (NTCDA), etc. serving as host material.

<Common Electrode 53>

The common electrode 53 may be formed with, for example, ITO, IZO or elemental metal such as Al.

3. Method of Manufacturing Organic EL Device 70

Figure 5:
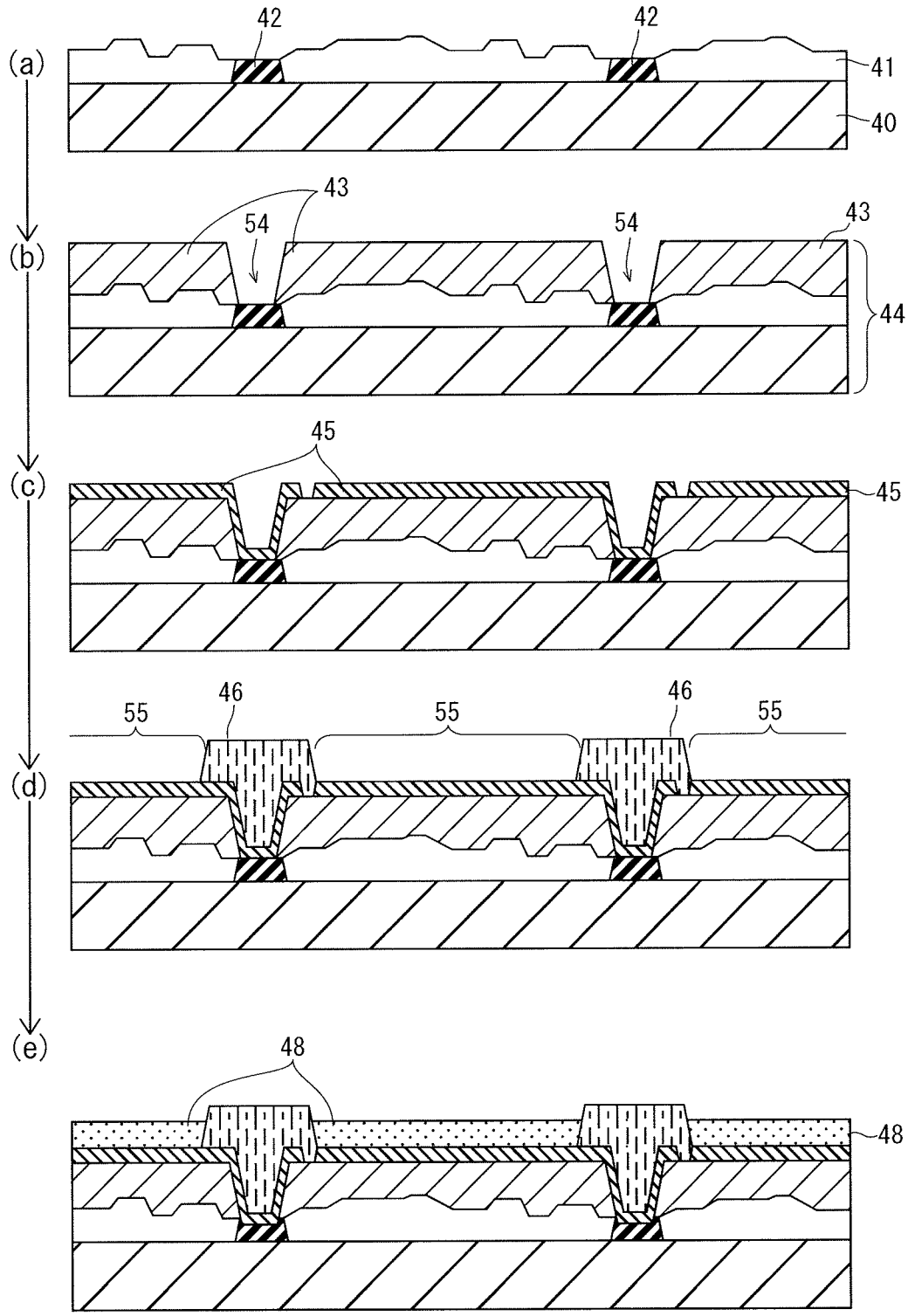
FIG. 5 is a schematic cross-sectional view showing a process of manufacturing an organic EL device pertaining to Embodiment 2 of the present invention.
Figure 6:
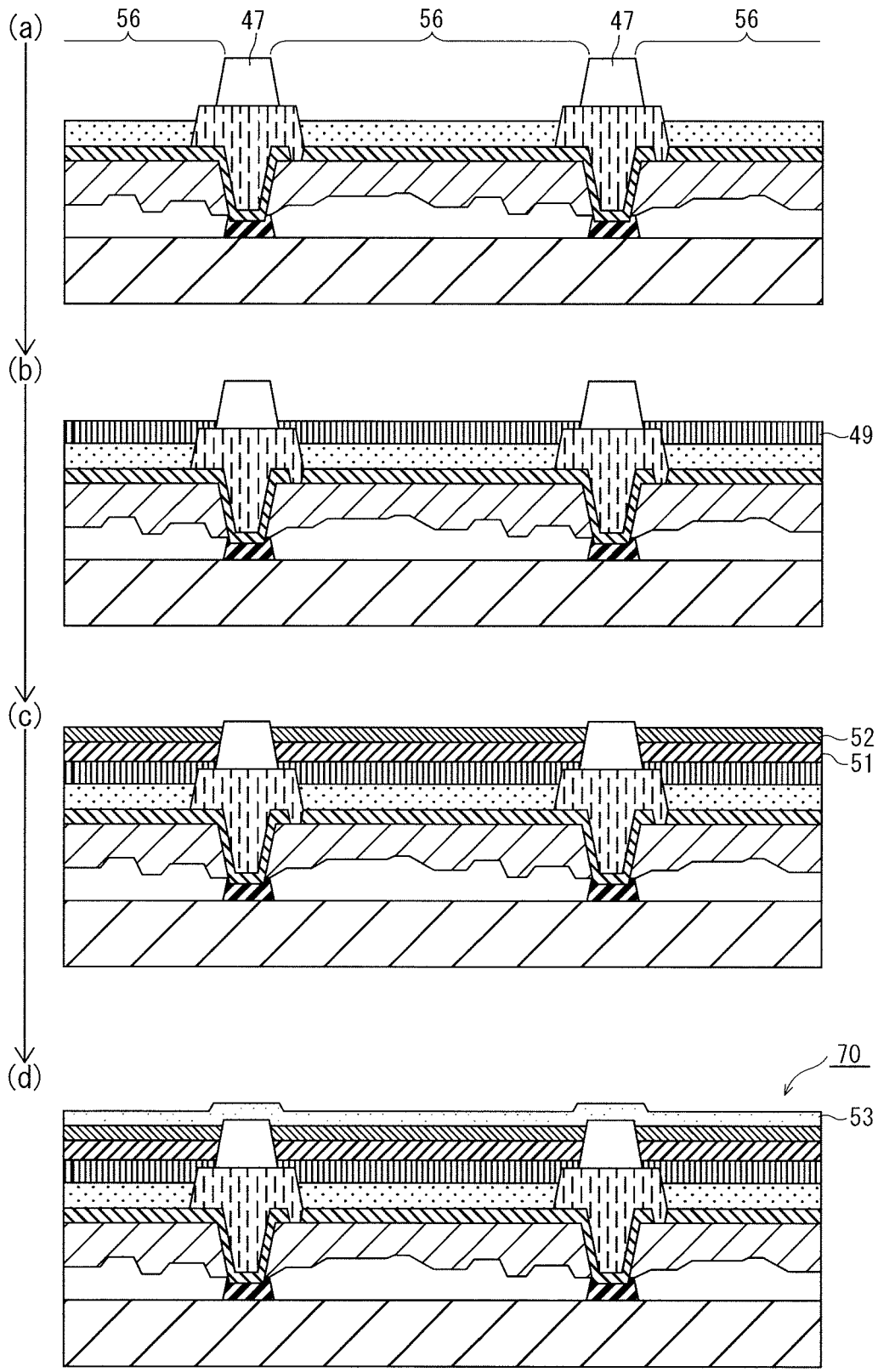
FIG. 6 is a schematic cross-sectional view showing a process of manufacturing an organic EL device pertaining to Embodiment 2 of the present invention.

The following describes a method of manufacturing the organic EL device 70 pertaining to the present embodiment, with reference to FIG. 5 and FIG. 6. FIG. 5 and FIG. 6 are schematic cross-sectional views showing a process of manufacturing the organic EL device 70 pertaining to the present embodiment.

The organic EL device manufacturing method pertaining to the present embodiment includes the following sequential steps.

A substrate preparation step: a step of preparing a substrate 44 (Part (a) and (b) of FIG. 5);

A first electrode formation step: a step of forming a pixel electrode 45 on the substrate 44 (Part (c) of FIG. 5);

A first bank formation step: a step of forming, on the substrate 44, a first bank 46 defining a first aperture 55 (Part (d) of FIG. 5);

A hole injection layer formation step: a step of forming a hole injection layer 48 on the pixel electrode 45 (Part (e) of FIG. 5);

A second bank formation step: a step of forming, on the first bank 46, a second bank 47 defining a second aperture 56 (Part (a) of FIG. 6);

A hole transport layer formation step: a step of forming a hole transport layer 49 on the hole injection layer 48 (Part (b) of FIG. 6;

A light-emitting layer formation step: a step of forming a light-emitting layer 51 on the hole transport layer 49 (Part (c) of FIG. 6);

An electron transport layer formation step: a step of forming an electron transport layer 52 on the light-emitting layer 51 (Part (c) of FIG. 6); and a second electrode formation step: a step of forming a common electrode 53 on the second bank 47 and the electron transport layer 52 (Part (d) of FIG. 6).

Note that the hole injection layer 48 formed by the manufacturing method pertaining to the present embodiment corresponds to the "first organic functional film" pertaining to each of the above-described aspects. Furthermore, the first electrode formation step, the first bank formation step, the hole injection layer formation step, the second bank formation step, the hole transport layer formation step and the second bank formation step pertaining to the present embodiment respectively correspond to the first electrode formation step, the first bank formation step, the first organic functional film formation step, the second bank formation step, the second organic functional film formation step and the second electrode formation step pertaining to Embodiment 1 described above, and the same steps are performed.

<Substrate Preparation Step>

As shown in Part (a) of FIG. 5, first, a substrate body 40 on which a TFT layer 41 and power supply electrodes 42 are formed is prepared.

Next, a planarizing film 43 is formed to cover the upper surfaces of the TFT layer 41 and the power supply electrode 42, by using a photolithography method. The planarizing film 43 is formed to have a film thickness of approximately 4 µm, by using organic material having excellent insulation properties.

Next, as shown in Part (b) of FIG. 5, a plurality of contact holes 54 are formed such that a portion of the upper surface of each of the power supply electrodes 42. Here, as shown in FIG. 4, each of the contact holes 54 is formed between an adjacent pair of first apertures 55.

Note that the apertures in the contact holes 54 can be formed at the same time as the formation of the planarizing film 43 by using a predetermined pattern mask. However, the method of forming the contact holes 54 is not limited to the above-described method. The contact holes 54 may be formed by, for example, first forming the planarizing film 43 uniformly, and then removing portions of the planarizing film 43 at predetermined positions.

The substrate 44 is prepared by performing the above-described steps.

<First Electrode Formation Step>

As shown in Part (c) in FIG. 5, the pixel electrodes 45 made of metal material are formed on the substrate 44 by using a vacuum deposition method or a sputtering method. The pixel electrodes 45 are formed to include a metal layer having a film thickness of approximately 150 nm, and are partitioned for each pixel. The pixel electrodes 45 are also formed along the sidewall surfaces of the planarizing film 43 facing the contact holes 54, and are electrically connected with power supply electrodes 42.

Here, the surfaces of the pixel electrodes 45 may be covered with ITO. Also, the pixel electrodes 45 may be a light-transmissive electrically-conductive layer made of a metal oxide such as ITO or IZO.

<First Bank Formation Step>

The first bank 46 is formed by the same step as the first bank formation step pertaining to Embodiment 1 described above. As shown in Part (d) of FIG. 5, the first bank 46 defines the plurality of first apertures 55, and the pixel electrode 45 is exposed from the bottom of each first aperture 55.

<Hole Injection Layer Formation Step>

The hole injection layer 48 is formed inside each first aperture 55 by performing the same step as the first organic functional film formation step pertaining to Embodiment 1 described above. As shown in part (e) of FIG. 5, in each of the first apertures 55, the hole injection layer 48 is in contact with the upper surface of the pixel electrode 45.

<Second Bank Formation Step>

Next, the second bank 47 is formed on the upper surface of each first bank 46 by the same step as the second bank formation step pertaining to Embodiment 1 described above. Also in this embodiment, as shown in Part (a) of FIG. 6, the cross-section of the bottom of the second bank 47 is set to be smaller in size than the cross section of the upper surface of the first bank 46.

<Hole Transport Layer Formation Step>

Next, the hole transport layer 49 is formed on the hole injection layer 48 by performing the same step as the second organic functional film formation step pertaining to Embodiment 1 described above. As shown in Part (b) of FIG. 6, the hole transport layer 49 is formed to cover the entire surface of the hole injection layer 48 so as to be in contact with portions of the sidewall surfaces of the first bank 46 and the second bank 47.

<Light-Emitting Layer Formation Step>

Next, an organic material of the light-emitting layer 51 and a solvent is mixed in a predetermined proportion, thereby controlling the properties of the ink for forming the organic light-emitting layer 51. Then, by using an inkjet method for example, the ink having the controlled properties is dripped into the second aperture 56 from the ink jet head, thereby coating the entire surface of the hole transport layer 49 with a droplet of the ink.

Next, as shown in Part (c) of FIG. 6, the solvent contained in the droplets is dried to evaporate, and is heated and baked as necessary, and thus the light-emitting layer 51 is formed.

Note that the light-emitting layer formation step pertaining to the present embodiment corresponds to the second organic functional film formation step pertaining to each of the above-described aspects.

<Electron Transport Layer Formation Step>

Next, an organic material of the electron transport layer 52 and a solvent is mixed in a predetermined proportion, thereby controlling the properties of the ink for forming the organic material of the electron transport layer 52. Then, by using an inkjet method for example, the ink having the controlled properties is dripped into the second aperture 56 from the ink jet head, thereby coating the entire surface of the light-emitting layer 51 with a droplet of the ink.

Next, as shown in Part (c) of FIG. 6, the solvent contained in the droplets is dried to evaporate, and is heated and baked as necessary, and thus the electron transport layer 52 is formed.

Note that in the present embodiment, sodium fluoride (NaF) is used as an example of the material of the electron transport layer 52.

<Common Electrode Formation Step>

Next, by using a vacuum deposition method or a sputtering method, the common electrode 53 made of metal oxide material is formed to cover the upper surface of the second bank 47 and the entire surface of the electron transport layer 52 as shown in Part (d) of FIG. 6.

Since a top-emission type organic EL device is adopted as an example of the organic EL device pertaining to the present embodiment, the common electrode 53 pertaining to the present embodiment is light-transmissive. For example, the common electrode 53 may be formed with ITO or IZO. Alternatively, an extremely thin common electrode, having a thickness of approximately 10 nm for example, may be formed by using metal material such as aluminum. Also in this case, the common electrode is light-transmissive since the film thickness is extremely thin, and thus a top-emission type device can be realized.

Although not depicted in the drawing, a sealing layer made of light-transmissive material such as SiN or SiON is formed on the common electrode 47 by using a sputtering method or a CVD method, for example.

The organic EL device 70 is completed by the above-described steps.

In the present embodiment, a method of manufacturing an organic EL device is adopted as an example of the method of manufacturing an organic electronic device. Accordingly, the hole injection layer 48 is formed to cover the entire surfaces of the pixel electrodes 45 and also cover the sidewall surfaces of the first bank 46.

Furthermore, also in the present embodiment, at the formation of the hole injection layer 48, only the first bank 46 exists and the second bank 47 does not exist. Therefore, there is no possibility that a portion of the hole injection layer 48 covers the sidewall surfaces of the second bank 47

Moreover, since the second aperture 56 is greater in size than the first aperture 55, it is possible to surely cover the hole injection layer 48 with the hole transport layer 49. Therefore, it is possible to surely prevent the occurrence of the leak current paths between the hole injection layer 48 and the common electrode 53.

Note that when the hole transport layer 49 corresponds to the "first organic functional film" pertaining to each of the above-described aspects, the light-emitting layer 51 serves as the "second organic functional film". The hole injection layer 48 and the hole transport layer 49 are formed at the same time after the first bank formation step is performed, and then the second bank formation step is performed.

Alternatively, the first bank formation step is performed after the hole injection layer 48 is formed on the first electrode by using, for example, a vacuum deposition method, next the hole transport layer 49 corresponding to the "first organic functional film" is formed, and then the second bank formation step is performed.

[Experiments and Analysis]

The organic electronic device manufacturing method and the organic EL device manufacturing method pertaining to the above-described aspects are characterized mainly by performing the first organic functional film formation step after performing the first bank formation step and before performing the second bank formation step. Adoption of such a manufacturing method adhering to the order of the steps surely prevents the phenomenon in which the first organic functional film remains at a high position on the sidewall surface of the bank facing the aperture. Therefore, the above-described method surely prevents the occurrence of leak current paths between the first organic functional film and the second electrode, which do not pass through the second organic functional film to be inserted between the first organic functional film and the second electrode.

The following shows results of verification of the effect of preventing the climbing phenomenon, using, as a verification sample, an organic EL device manufactured by the manufacturing method pertaining to Embodiment 2 described above.

A comparative sample for the verification was formed by first forming the first bank and the second bank made of the same material as the material of the first bank of the above-described verification sample is formed by using a method pertaining to a conventional method, and then forming the hole injection layer. Note that the other steps for forming the comparative sample are performed under the same manufacturing conditions as the verification sample.

When observing the cross section during the verification, a scanning transmission electron microscope (model S-4700, Hitachi Ltd.) was used.

Note that in the verification sample and the comparative sample, the amount of the liquid-repellent component contained in the photosensitive resin material used for forming the second bank was set to be greater than the photosensitive resin material used for forming the first bank, so as to give the lowest degree of liquid-repellency to the sidewall surface of the first bank, followed by the upper surface of the first bank, the sidewall surface of the second bank and the upper surface of the second bank in this order.

Figure 7:
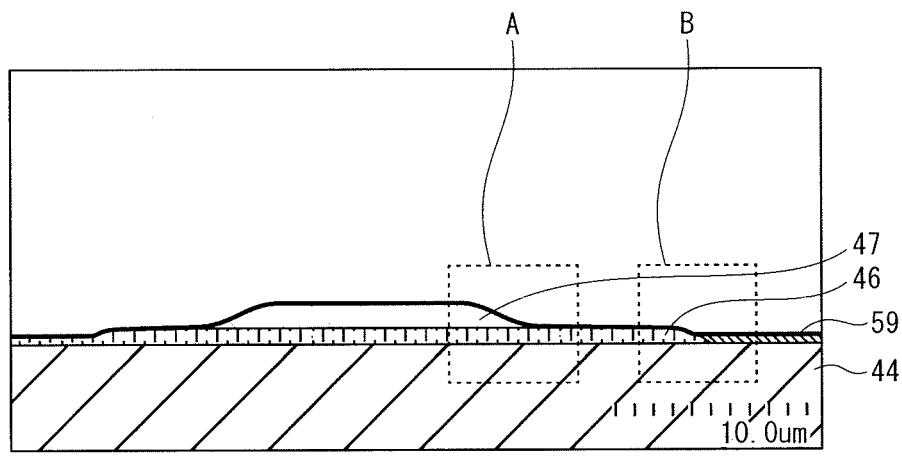
FIG. 7 is a schematic cross-sectional view showing a bank and an area around the bank of an organic EL device manufactured by a manufacturing method pertaining to Embodiment 2 of the present invention.

FIG. 7 shows the observation result of the cross section of the bank and the vicinity of the bank of the verification sample. In FIG. 7, the hole injection layer 48, the hole transport layer 49, the light-emitting layer 51, the electron transport layer 52 and the second electrode 53 are depicted as a single laminate 59, for the sake of convenience.

As shown in FIG. 7, the first bank 46 is formed on the substrate 44 in the same manner as Embodiment 2 described above, and, on the upper surface of the first bank 46, the second bank 47 defining an aperture that is greater in size than the aperture defined by the first bank 46 is formed in the same manner as Embodiment 2 described above. As seen from the drawing, the laminate 59 (including the hole injection layer 48, the hole transport layer 49, the light-emitting layer 51, the electron transport layer 52 and the second electrode 53) is formed in a preferable condition within the apertures defined by being surrounded by the first bank 46 and the second bank 47.

In contrast with FIG. 5 for example, which schematically shows the shapes of the banks, the sidewall surfaces and the top surfaces of the banks in reality have gently-curved shape projecting outward, as shown in FIG. 7. For this reason, the height of each bank is represented in relation to the maximum height as a reference value.

Regarding the shape of each bank, the aperture defined by being surrounded by the bank has such a shape that the diameter thereof gradually increase from the side of the substrate (the lower side) to the upper side. Therefore, in plan view, the bottom edge of the second aperture of the second bank 47 is located at the same position as, or set back from, the bottom edge of the first aperture of the first bank 46. This configuration makes it easy to form the second aperture to be greater than the first aperture at any level. However, the apertures defined by being surrounded by the first bank and the second bank may have a diameter that is constant at any level.

Although not depicted in FIG. 7, a passivation film 57 (see FIGS. 8A and 8B described below) is formed on the second electrode 53 included in the laminate 59. In FIG. 7, the difference in color density between each layer, which was observed visually, is depicted by enclosing each layer with a black line and hatching each layer. The same applies to FIGS. 8A and 8B and FIGS. 9A and 9B.

Figure 8A:
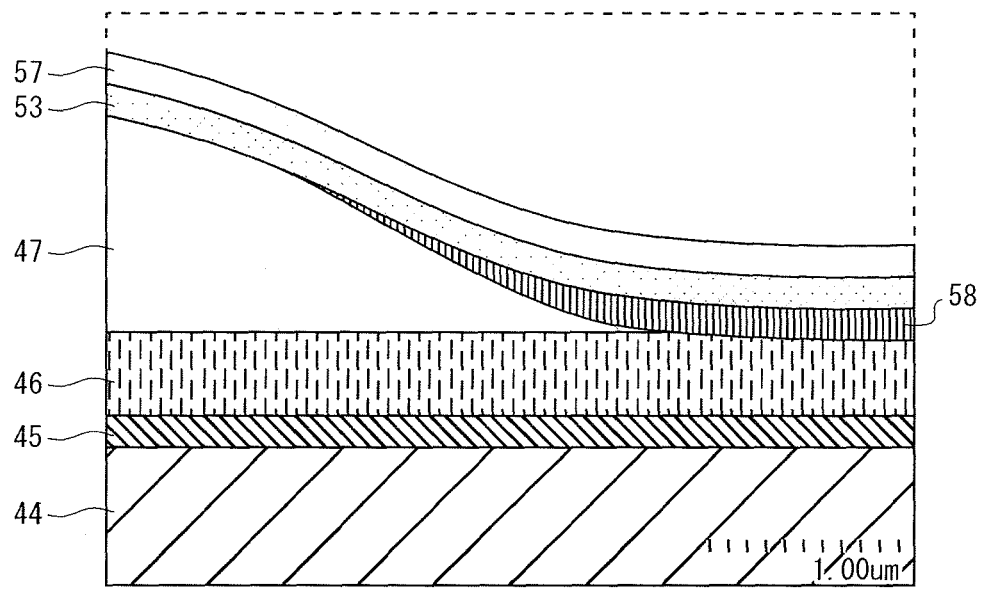
FIG. 8A is a schematic cross-sectional view magnifying an area A in FIG. 7.
Figure 8B:
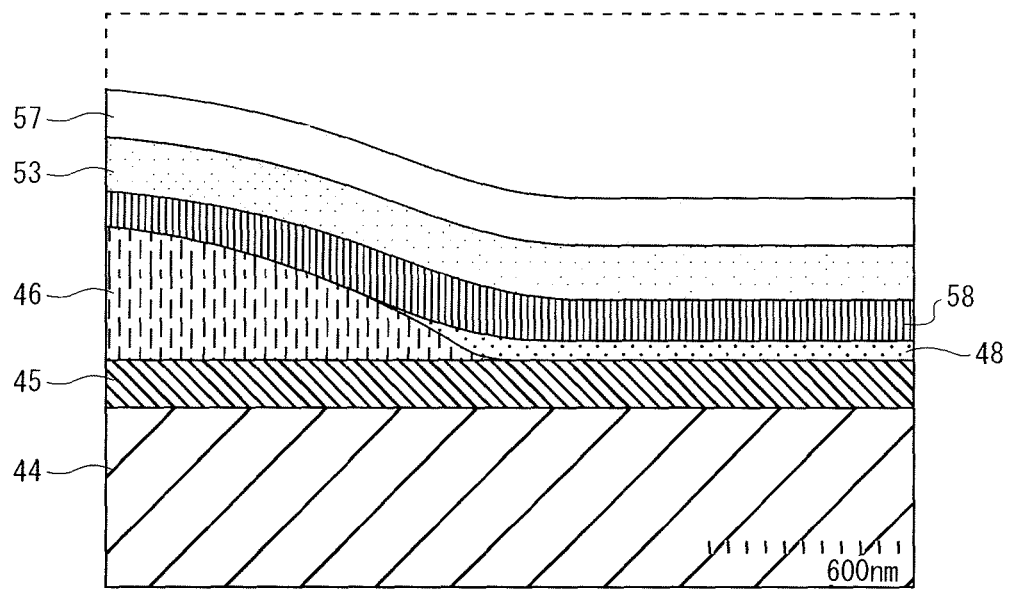
FIG. 8B is a schematic cross-sectional view magnifying an area B in FIG. 7.

Next, the area A in FIG. 7 is described with reference to FIG. 8A. FIG. 8A is a cross-sectional view magnifying the area A in FIG. 7, which is in the vicinity of the second bank 47. The area B in FIG. 7 is described with reference to FIG. 8B. FIG. 8B is a cross-sectional view magnifying the area B in FIG. 7, which is in the vicinity of the first bank 46.

First, as shown in FIG. 8B, the hole injection layer 48 covers the exposed portion of the pixel electrode 45 within the first aperture defined by the first bank 46, and covers also a portion of the sidewall of the first bank 46. Thus the hole injection layer 48 has a uniform thickness. Note that the laminate 58 including the hole transport layer 49, the light-emitting layer 51 and the electron transport layer 52 is formed to cover the entire surface of the hole injection layer 48 and the sidewall surface of the first bank 46.

Second, as shown in FIG. 8A, the hole injection layer 48 is formed so as not to reach the upper surface of the first bank 46 or the sidewall of the second bank 47, and the hole transport layer 49 (not depicted) included in the laminate 58 is formed over the hole injection layer 48, in a preferable condition.

Figure 9A:
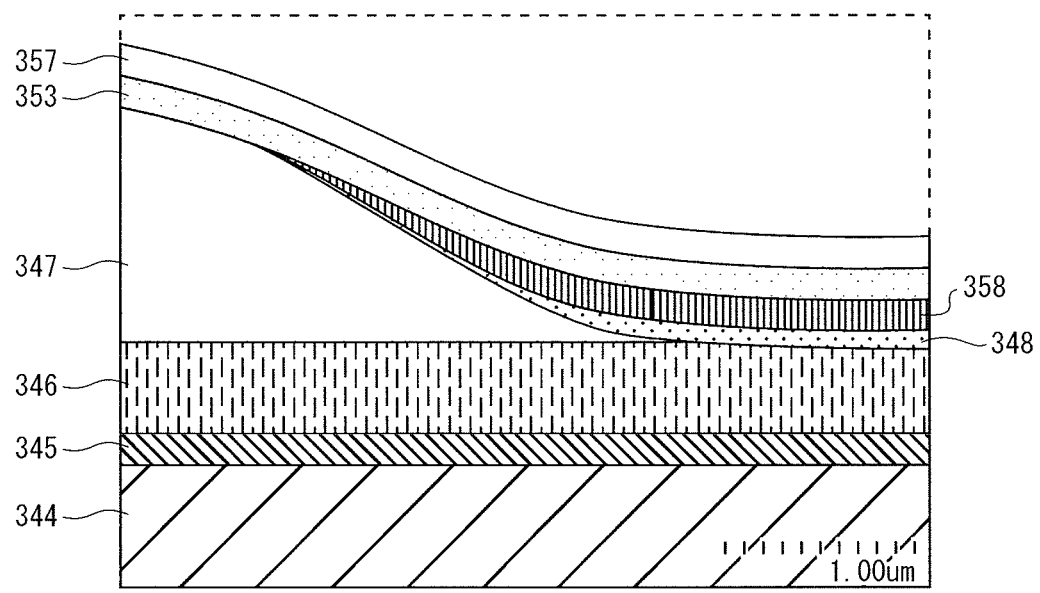
FIG. 9A is a cross-sectional view showing an area of an organic EL device manufactured by a manufacturing method pertaining to a comparative sample, corresponding to FIG. 8A.
Figure 9B:
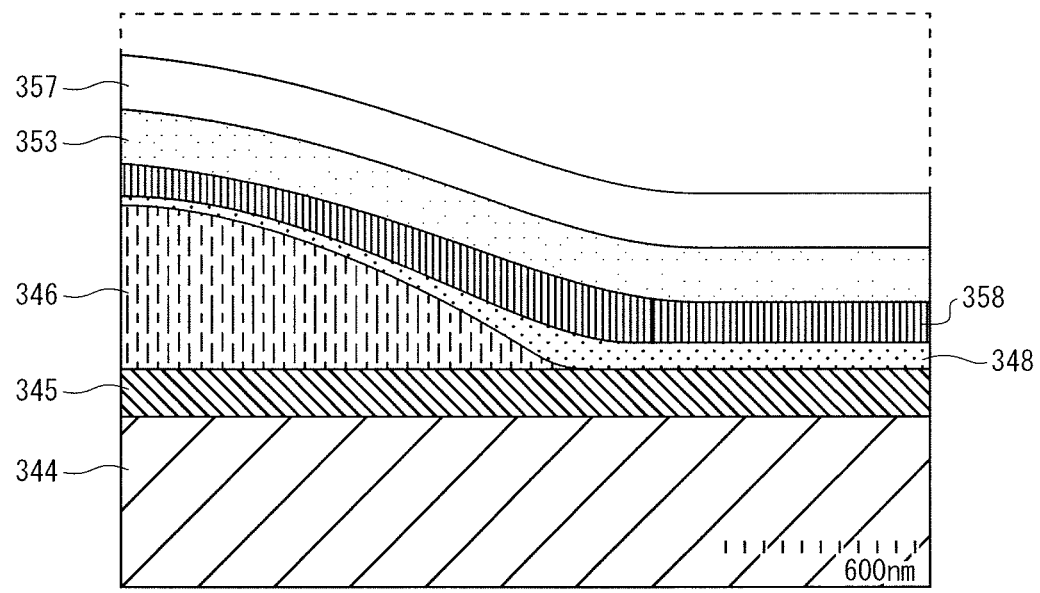
FIG. 9B is a cross-sectional view showing an area of an organic EL device manufactured by a manufacturing method pertaining to a comparative sample, corresponding to FIG. 8B.

FIG. 9A shows a cross-sectional view of the comparative sample with respect to an area corresponding to the area A shown in FIG. 7, and FIG. 9B shows a cross-sectional view of the comparative sample with respect to an area corresponding to the area B shown in FIG. 9B.

First, as shown in FIG. 9B, the hole injection layer 348 covers the entire surface of the exposed portion of the pixel electrode 345 within the first aperture defined by the first bank 346, and covers the entire sidewall surface of the first bank 346. The laminate 358 including the hole transport layer, the light-emitting layer and the electron transport layer is formed to cover the surface of the hole injection layer 348, including the sidewall surface of the first bank 346. Also, the common electrode 353 and the passivation film 357 are sequentially layered on the laminate 358.

Second, as shown in FIG. 9B, the hole injection layer 348 is formed not only on the upper surface of the first bank 346, but also formed so as to reach the surface of the second bank 347.

The results of the cross section observation of the verification sample and the comparative sample show that even when the upper surface of the first bank is provided with a greater degree of liquid-repellency than the sidewall surface, the method using the bank configuration pertaining to conventional technology cannot prevent the climbing phenomenon of the first organic functional film on the sidewall surface of the first bank, and cannot surely prevent the occurrence of the leak current paths caused by the climbing phenomenon of the first organic functional film.

In contrast, when the manufacturing method pertaining to each of the above-described aspects is used, the phenomenon in which the upper edge of the first organic functional film reaches the sidewall surface of the second bank does not occur, and thus the manufacturing method pertaining to each of the above-described aspects can surely prevent the occurrence of the leak current paths caused by the climbing phenomenon of the first organic functional film.

[Other]

The organic electronic device manufacturing method and the organic EL device manufacturing method pertaining to embodiments of the present invention are describe above in details. However, the embodiments are merely examples for clearly explaining the configuration, functions and effects of the present invention, and therefore the present invention should not be limited to the above-described embodiments, and may be realized in any form insofar as having the essential features of the present invention.

<Organic Electronic Device Manufacturing Method>

(Application)

Organic electronic device that can be manufactured by the organic electronic device manufacturing method pertaining to the present invention is not limited to the organic EL device pertaining to Embodiment 2 described above. For example, besides organic EL devices, organic thin-film transistors may be manufactured by the method. Specifically, the present invention can be applied to an organic thin-film transistor effectively by regarding a drain electrode or a source electrode and a gate electrode as a pair of electrodes, an organic semiconductor layer inserted between the pair of electrodes as the first organic functional film, and a gate insulating layer as the second organic functional film. In this way, the present invention is applicable to any organic electronic devices having a laminate in which the first organic functional film and the second organic functional film are inserted between the pair of electrodes, and the same effect as described above can be achieved in this case as well.

<First Organic Functional Film Formation Step>

In Embodiment 1 described above, the first organic functional film is formed so as to cover a portion of the sidewall surface of the first bank. In other words, the first organic functional film is formed such that the upper edge thereof is located lower than the upper edge of the sidewall surface of the first bank.

However, the shape of the first organic functional film pertaining to the present invention is not limited to the above-described shape, and may be formed so as to cover the entire sidewall surface. In other words, the first organic functional film may be formed such that the upper edge thereof is located at substantially the same position as the upper edge of the sidewall surface of the first bank.

Furthermore, according to the present invention, the upper edge of the first organic functional film may be located higher than the upper edge of the sidewall surface of the first bank, and run upon the upper surface of the first bank. If this is the case, the portion of the first organic functional film that runs upon the upper surface of the first bank will be covered with the second bank layered in the subsequent step.

Also, in Embodiment 1 described above, the first organic functional film is formed to cover (or to be in contact with) the exposed portion of the first electrode within the first aperture. However, the present invention does not necessarily have such a configuration. The manufacturing method pertaining to the present invention only requires that the first organic functional film be formed on or above the first electrode. For example, the first organic functional film and the first electrode may be not in direct contact, and other organic functional film (i.e. electrically-conductive organic functional film or not electrically-conductive organic functional film) or inorganic film may be formed between the first electrode and the first organic functional film.

(Second Organic Functional Film Formation Step)

In Embodiment 1 described above, the second organic functional film is formed to cover a portion of the sidewall surface of the second bank.

However, the configuration of the second organic functional film pertaining to the present invention is not limited to the above-described configuration. For example, the second organic functional film may cover at least a portion of the area of the upper surface of the first bank where the second bank is not formed, without covering the sidewall surface of the second bank. Alternatively, the second organic functional film may cover the entire sidewall surface of the second bank.

(Second Bank Formation Step)

In Embodiment 1 described above, the second bank is formed on the upper surface of the first bank such that a portion of the upper surface of the first bank is exposed.

However, the configuration of the second organic functional film pertaining to the present invention is not limited to the above-described configuration. For example, the second bank may be formed on the upper surface of the first bank so as to cover the entire area of the upper surface of the first bank.

Furthermore, according to the present invention, when the first bank has a trapezoidal cross-section with the bottom surface greater than the upper surface, the second bank may be formed so as to cover a portion (upper portion) of the sidewall surface of the first bank and the upper surface of the first bank.

<Organic EL Device Manufacturing Method>

(First Electrode Formation Step and Second Electrode Formation Step)

In Embodiment 2 described above, a method of manufacturing a top-emission type organic EL device is described as an example. Therefore, in the second electrode formation step of Embodiment 2 described above, a light-transmissive film made of ITO or IZO, or an extremely thin light-transmissive film made of metal material such as aluminum (Al) is formed as the common electrode.

However, organic EL devices manufactured by the manufacturing method pertaining to the present invention are not limited to top-emission type devices, and may be bottom-emission type devices. When manufacturing bottom-emission type devices, the common electrode may be formed as a metal film having the function of reflecting light. Also, when manufacturing bottom-emission type devices, the pixel electrode formed in the first electrode formation step is configured as a light-transmissive electrically-conductive layer. If this is the case, the light-transmissive electrically-conductive layer may be, for example, a metal oxide layer made of ITO or IZO, or an extremely thin metal layer having a film thickness of approximately 10 nm.

(First Functional Layer Formation Step)

In Embodiment 2 described above, the laminate composed of the hole injection layer and the hole transport layer is explained as the first organic functional film. However, the present invention does not necessarily have such a configuration. For example, the laminate may be composed only of the hole injection layer. Alternatively, the laminate composed of the electron injection layer and the electron transport layer may serve as the first organic functional film, and the hole transport layer and the hole injection layer are sequentially layered on the light-emitting layer as the second functional layer.

Furthermore, only one of the electron injection layer or the electron transport layer may serve as the first organic functional film, and the hole transport layer and the hole injection layer may be layered on the light-emitting layer serving as the second functional layer.

INDUSTRIAL APPLICABILITY

The present invention is useful for manufacturing an organic electronic device and an organic EL device with excellent device performance, while preventing the climbing phenomenon during the formation of the organic functional film.

REFERENCE SIGNS LIST

- 1, 44: Substrate
- 2: First electrode
- 3, 46: First bank
- 4, 47: Second bank
- 5: First organic functional film
- 6: Second organic functional film
- 7, 55: First aperture
- 8, 56: Second aperture
- 9: Second electrode
- 45: Pixel electrode
- 48: Hole injection layer
- 49: Hole transport layer
- 50: First functional layer
- 51: Second functional layer
- 53: Common electrode
- 70: Organic EL device
- 71: Organic electronic device

The invention claimed is:

1. An organic electronic device manufacturing method, comprising:
    forming a first electrode on a substrate;
    forming, on the substrate, a first bank defining a first aperture, such that at least a portion of the first electrode is exposed at a bottom of the first aperture;
    forming a first organic functional film by applying a droplet of a first ink into the first aperture, the first ink containing a first organic material;
    after the forming of the first organic functional film, forming, on the first bank, a second bank defining a second aperture, the second aperture communicating with the first aperture;
    forming a second organic functional film by applying a droplet of a second ink into the second aperture so as to cover a surface of an exposed portion of the first organic functional film, the second ink containing a second organic material differing from the first organic material; and
    forming a second electrode on the second organic functional film, wherein
    in the forming of the second bank, the second bank is formed such that, in plan view, a bottom edge of a sidewall surface of the second bank facing the second aperture is located at the same position as or is set back from a bottom edge of a sidewall surface of the first bank facing the first aperture, and
    in the forming of the second organic functional film, the droplet of the second ink is applied such that an upper edge of the second organic functional film within the second aperture is located at a same level as or at a higher level than the bottom edge of the sidewall surface of the second bank.

2. The organic electronic device manufacturing method of claim 1, wherein
    the forming of the first bank includes:
        forming a first bank film on the substrate, the first bank film containing a first bank material; and
        forming the first aperture by exposing a portion of the first bank film to light and developing the first bank film by using a first developer,
    the forming of the second bank includes:
        forming a second bank film on the first bank and the first organic functional film, the second bank film containing a second bank material; and
        forming the second aperture by exposing a portion of the second bank film to light and developing the second bank film by using a second developer, and
    in the forming of the second bank film during the forming of the second bank, a material that is etchable by using the second developer is used as the second bank material, the first organic functional film being resistant to etching using the second developer.

3. The organic electronic device manufacturing method of claim 2, wherein
    in the forming of the first aperture during the forming of the first bank, alkaline developer is used as the first developer, and
    in the forming of the second aperture during the forming of the second bank, aqueous developer is used as the second developer.

4. The organic electronic device manufacturing method of claim 1, wherein
    the forming of the first bank includes applying a liquid-repellent treatment to a surface of the first bank,
    the forming of the second bank includes applying a liquid-repellent treatment to a surface of the second bank,
    in the applying of a liquid-repellent treatment to the surface of the first bank, the liquid-repellent treatment is performed such that an upper surface of the first bank has a first contact angle relative to the droplet of the first ink, and the sidewall surface of the first bank facing the first aperture has a second contact angle relative to the droplet of the first ink, the first contact angle being greater than the second contact angle, and
    in the applying of a liquid-repellent treatment to the surface of the second bank, the liquid-repellent treatment is performed such that an upper surface of the second bank has a third contact angle relative to the droplet of the second ink, and the sidewall surface of the second bank facing the second aperture has a fourth contact angle relative to the droplet of the second ink, the third contact angle being greater than the fourth contact angle.

5. The organic electronic device manufacturing method of claim 4, wherein
    in the applying of a liquid-repellent treatment to the surface of the first bank and the applying of a liquid-repellent treatment to the surface of the second bank, each liquid-repellent treatment is performed such that the third contact angle is greater than the fourth contact angle, the fourth contact angle is greater than the first contact angle, and the first contact angle is greater than the second contact angle.

6. The organic electronic device manufacturing method of claim 2, wherein
    in the forming of the first bank film during the forming of the first bank, the first bank film is formed to have a liquid-repellent surface by using a liquid-repellent material as the first bank material, and
    in the forming of the second bank film during the forming of the second bank, the second bank film is formed to have a liquid-repellent surface by using a liquid-repellent material as the second bank material.

7. The organic electronic device manufacturing method of claim 1, wherein in the forming of the first organic functional film, the first organic functional film is formed such that an upper edge thereof does not reach the upper surface of the first bank.

8. An organic EL device manufacturing method, comprising:

forming a first electrode on a substrate;

forming, on the substrate, a first bank defining a first aperture, such that at least a portion of the first electrode is exposed at a bottom of the first aperture;

forming a first organic functional film by applying a droplet of a first ink into the first aperture, the first ink containing a first organic material;

after the forming of the first organic functional film, forming, on the first bank, a second bank defining a second aperture, the second aperture communicating with the first aperture;

forming a second organic functional film by applying a droplet of a second ink into the second aperture so as to cover a surface of an exposed portion of the first organic functional film, the second ink containing a second organic material differing from the first organic material; and forming a second electrode on the second organic functional film, wherein in the forming of the second bank, the second bank is formed such that, in plan view, a bottom edge of a sidewall surface of the second bank facing the second aperture is located at the same position as or is set back from a bottom edge of a sidewall surface of the first bank facing the first aperture, in the forming of the second organic functional film, the droplet of the second ink is applied such that an upper edge of the second organic functional film within the second aperture is located at a same level as or at a higher level than the bottom edge of the sidewall surface of the second bank, in the forming of the first organic functional film, a laminate including a carrier injection layer and a carrier transport layer is formed as the first organic functional film, and in the forming of the second organic functional film, a light-emitting layer is formed as the second organic functional film, the light-emitting layer causing electroluminescence by recombination of holes and electrons.

* * * * *